(12) United States Patent
Kim

(10) Patent No.: US 10,587,246 B2
(45) Date of Patent: Mar. 10, 2020

(54) SEMICONDUCTOR CIRCUIT AND METHOD OF OPERATING THE CIRCUIT

(71) Applicant: SAMSUNG ELECTRONICS CO., LTD., Suwon-si (KR)

(72) Inventor: Min-Su Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/212,193

(22) Filed: Dec. 6, 2018

(65) Prior Publication Data

US 2019/0109583 A1 Apr. 11, 2019

Related U.S. Application Data

(63) Continuation of application No. 15/247,430, filed on Aug. 25, 2016, now Pat. No. 10,177,745, which is a
(Continued)

(30) Foreign Application Priority Data

Mar. 16, 2012 (KR) ........................ 10-2012-0027387
Mar. 17, 2014 (KR) ........................ 10-2014-0031002

(51) Int. Cl.
*H03K 3/356* (2006.01)
*H03K 3/012* (2006.01)
*G01R 31/3185* (2006.01)

(52) U.S. Cl.
CPC ..... *H03K 3/012* (2013.01); *G01R 31/318541* (2013.01); *H03K 3/356104* (2013.01); *H03K 3/356139* (2013.01)

(58) Field of Classification Search
CPC ............. H03K 3/35625; H03K 3/0375; H03K 3/356156
See application file for complete search history.

(56) References Cited

U.S. PATENT DOCUMENTS 6,462,596 B1 10/2002 Varma
7,154,319 B2 12/2006 Kim
(Continued)

FOREIGN PATENT DOCUMENTS

KR 10-2002-0074848 A 10/2002
KR 10-2009-0046157 A 5/2009
(Continued)

OTHER PUBLICATIONS

Communication dated Jun. 10, 2014, by the Australian Patent Office in corresponding Application No. 2013201156.
(Continued)

*Primary Examiner* — Sibin Chen
(74) *Attorney, Agent, or Firm* — Sughrue Mion, PLLC

(57) ABSTRACT

Provided is a semiconductor circuit which includes a first circuit configured to determine a voltage level of a feedback node based on a voltage level of input data, a voltage level of a latch input node, and a voltage level of a clock signal, a second circuit configured to pre-charge the latch input node based on the voltage level of the clock signal, a third circuit configured to pull down the latch input node based on the voltage level of the feedback node and the voltage level of the clock signal, a latch configured to output output data based on the voltage level of the clock signal and the voltage level of the latch input node, and a control circuit included in at least one of the first to third circuits and the latch and configured to receive the control signal.

10 Claims, 37 Drawing Sheets

Related U.S. Application Data continuation of application No. 14/645,818, filed on Mar. 12, 2015, now Pat. No. 9,473,123, which is a continuation-in-part of application No. 13/624,492, filed on Sep. 21, 2012, now Pat. No. 9,252,754.

(56) References Cited

U.S. PATENT DOCUMENTS

| | | | |
|---|---|---|---|
| 7,202,724 | B2 | 4/2007 | Kim |
| 7,391,250 | B1 | 6/2008 | Chuang |
| 7,724,605 | B2 | 5/2010 | Kong et al. |
| 7,843,243 | B2 | 11/2010 | Kim |
| 7,915,925 | B2 | 3/2011 | Cong |
| 8,132,039 | B1 | 3/2012 | Nguyen |
| 2002/0075053 | A1 | 6/2002 | Ganesan |
| 2005/0151560 | A1 | 7/2005 | Hirata |
| 2005/0225372 | A1* | 10/2005 | Kim ................. H03K 3/012 327/218 |
| 2006/0103443 | A1 | 5/2006 | Rhee et al. |
| 2007/0001734 | A1 | 1/2007 | Onouchi et al. |
| 2007/0250284 | A1 | 10/2007 | Takeoka et al. |
| 2010/0073028 | A1 | 3/2010 | Kim |
| 2010/0083064 | A1 | 4/2010 | Cong |
| 2010/0308864 | A1 | 12/2010 | Lee et al. |
| 2011/0317499 | A1* | 12/2011 | Bunce ................. G11C 7/22 365/189.11 |
| 2015/0151560 | A1 | 6/2015 | Marinkin et al. |

FOREIGN PATENT DOCUMENTS

| | | |
|---|---|---|
| KR | 10-2009-0059580 A | 6/2009 |
| KR | 10-2010-0132267 A | 12/2010 |

OTHER PUBLICATIONS

Communication dated Jul. 3, 2018, issued by the Indian Patent Office in counterpart Indian Patent Application No. 754/DEL/2013.
Communication dated Nov. 30, 2016, issued by the Netherlands Patent Office for Netherlands Patent Application No. 2010447.
Communication issued Jun. 10, 2014, by the Australian Patent Office in corresponding Application No. 2013201156.
Communication issued Jul. 3, 2018, issued by the Indian Patent Office in counterpart Indian Patent Application No. 754/DEL/2013.
Communication issued Nov. 30, 2016, issued by the Netherlands Patent Office for Netherlands Patent Application No. 2010447.
Communication dated Mar. 16, 2018, issued by the Korean Intellectual Property Office in counterpart Korean application No. 10-2012-0027387.

* cited by examiner

1200

1300

1400

SEMICONDUCTOR CIRCUIT AND METHOD OF OPERATING THE CIRCUIT

CROSS-REFERENCE TO RELATED APPLICATIONS

This is a continuation of U.S. application Ser. No. 15/247,430 filed Aug. 25, 2016, which is a continuation of U.S. application Ser. No. 14/645,818 filed Mar. 12, 2015, which is a continuation-in-part (CIP) application of U.S. application Ser. No. 13/624,492, filed on Sep. 21, 2012, and claims priority from Korean Patent Application No. 10-2012-0027387 filed on Mar. 16, 2012 and Korean Patent Application No. 10-2014-0031002 filed on Mar. 17, 2014, in the Korean Intellectual Property Office, the disclosures of which are incorporated herein in their entirety by reference.

BACKGROUND

1. Field

Apparatuses and methods consistent with exemplary embodiments relate to a semiconductor circuit and a method of operating the circuit.

2. Description of the Related Art

A flip-flop, which is one of semiconductor devices, stores input data in response to a clock signal and sequentially transmits the stored input data.

A related art master-slave flip-flop is widely used due to its advantages of a small area and low power consumption. However, there is a limitation in using the related art master-slave flip-flop for a high-speed chip due to a data-to-output latency. Accordingly, research has been conducted to find a flip-flop which is suitable for a high speed operation and low power consumption.

SUMMARY

Exemplary embodiments provide a semiconductor circuit capable of operating at a high speed and having low power consumption.

Exemplary embodiments also provide a method of operating a semiconductor circuit capable of operating at a high speed and having low power consumption.

These and other objects of the exemplary embodiments will be described in or be apparent from the following description of the preferred embodiments.

According to an aspect of an exemplary embodiment, there is provided a semiconductor circuit includes a first circuit configured to determine a voltage level of a feedback node based on a voltage level of input data, a voltage level of a latch input node and a voltage level of a clock signal, a second circuit configured to pre-charge the latch input node based on the voltage level of the clock signal, a third circuit configured to pull down the latch input node based on the voltage level of the feedback node and the voltage level of the clock signal, a latch configured to output output data based on the voltage level of the clock signal and the voltage level of the latch input node, and a control circuit included in at least one of the first circuit, the second circuit, the third circuit, and the latch and configured to receive the control signal, wherein the latch includes a first transistor gated to the voltage level of the latch input node and configured to pull up an output node, a second transistor gated to an inverted voltage level of the feedback node and configured to pull down the output node, and a third transistor connected in series to the second transistor, gated to the voltage level of the clock signal and configured to pull down the output node.

According to an aspect of another exemplary embodiment, there is provided a semiconductor circuit performing different operations according to a control signal supplied thereto, the semiconductor circuit including a first circuit, a second circuit, a third circuit, a latch and a control circuit. The first circuit may include a first transistor gated to a voltage level of input data and configured to provide a power voltage, a second transistor gated to a voltage level of a clock signal and configured to transmit an output of the first transistor to a feedback node, a third transistor gated to the voltage level of the input data and configured to provide a ground voltage, and a fourth transistor gated to a voltage level of a latch input node and configured to transmit an output of the third transistor to the feedback node The second circuit may include a fifth transistor gated to the voltage level of the clock signal and configured to transmit the power voltage to the latch input node The third circuit may include a sixth transistor gated to the voltage level of the clock signal and the sixth transistor configured to provide the ground voltage, and a seventh transistor gated to the voltage level of the feedback node and configured to transmit an output of the sixth transistor to the latch input node. The latch may output data based on the voltage level of the clock signal and the voltage level of the latch input node. The control circuit may be included in at least one of the first to third circuits and the latch, and may be configured to receive the control signal.

According to an aspect of still another exemplary embodiment, there is provided a method of operating a semiconductor circuit performing different operations according to a control signal supplied thereto, the method including determining a voltage level of a feedback node based on a voltage level of a clock signal and a voltage level of input data in response to the voltage level of the clock signal being at a first level, determining a voltage level of a latch input node based on the voltage level of the clock signal and the voltage level of the feedback node, outputting output data according to the voltage level of the latch input node which is in synchronization with the clock signal, and outputting the determined voltage level as output data in response to a voltage level of the control signal being a second level which is different from the first level.

According to an aspect of still another exemplary embodiment, there is provided a semiconductor circuit performing different operations according to a control signal supplied thereto, the semiconductor circuit including a first circuit configured to determine a voltage level of a feedback node based on at least one of a voltage level of input data, a voltage level of a latch input node, and a voltage level of a clock signal, a second circuit configured to pre-charge the latch input node to a first voltage based on the voltage level of the clock signal, a third circuit configured to pull down the latch input node to a second voltage based on the voltage level of the feedback node and the voltage level of the clock signal, and a control circuit included in at least one of the first to third circuits and configured to receive the control signal, wherein the control circuit includes first to third transistors, the first transistor is gated to the voltage level of the clock signal and configured to keep the feedback node at the second voltage, a second transistor is gated to the voltage level of the feedback node and configured to pull down the latch input node to the second voltage, and the third transistor is gated to the voltage level of the clock signal and connect the third transistor and the latch input node.

According to an aspect of still another exemplary embodiment, there is provided a semiconductor circuit including a first transistor gated to a voltage level of a first node and configured to pull up a second node to a first voltage, a second transistor gated to a voltage level of a third node and configured to pull down the second node to a second voltage, a third transistor connected in series to the second transistor, gated to a voltage level of a clock signal, and configured to pull down the second node, a fourth transistor gated to the voltage level of the first node and configured to keep the second node at the second voltage, a fifth transistor connected in series to the fourth transistor, gated to a voltage level of an inverted voltage level of the second node, and configured to keep the second node at the second voltage, a sixth transistor gated to the inverted voltage level of the second node and configured to keep the second node at the first voltage, and a seventh transistor connected in series to the sixth transistor, gated to the voltage level of the clock signal, and configured to keep the second node at the first voltage.

According to an aspect of still another exemplary embodiment, there is provided a semiconductor circuit performing different operations according to a control signal supplied thereto, the semiconductor circuit including: a first circuit configured to determine a voltage level of a feedback node based on a voltage level of input data, a voltage level of a latch input node, and a voltage level of a clock signal; a second circuit configured to pre-charge the latch input node based on the voltage level of the clock signal; a third circuit configured to pull down the latch input node based on the voltage level of the feedback node and the voltage level of the clock signal; a latch configured to output output data based on the voltage level of the clock signal and the voltage level of the latch input node; and a control circuit included in at least one of the first circuit, the second circuit, the third circuit, and the latch and configured to receive the control signal.

BRIEF DESCRIPTION OF THE DRAWINGS

The above and other features and advantages of the exemplary embodiments will become more apparent by describing in detail preferred embodiments thereof with reference to the attached drawings in which:

FIG. 29B is a circuit view of a semiconductor circuit according to a twenty-eighth exemplary embodiment of;

DETAILED DESCRIPTION OF THE EXEMPLARY EMBODIMENTS

Figure 1:
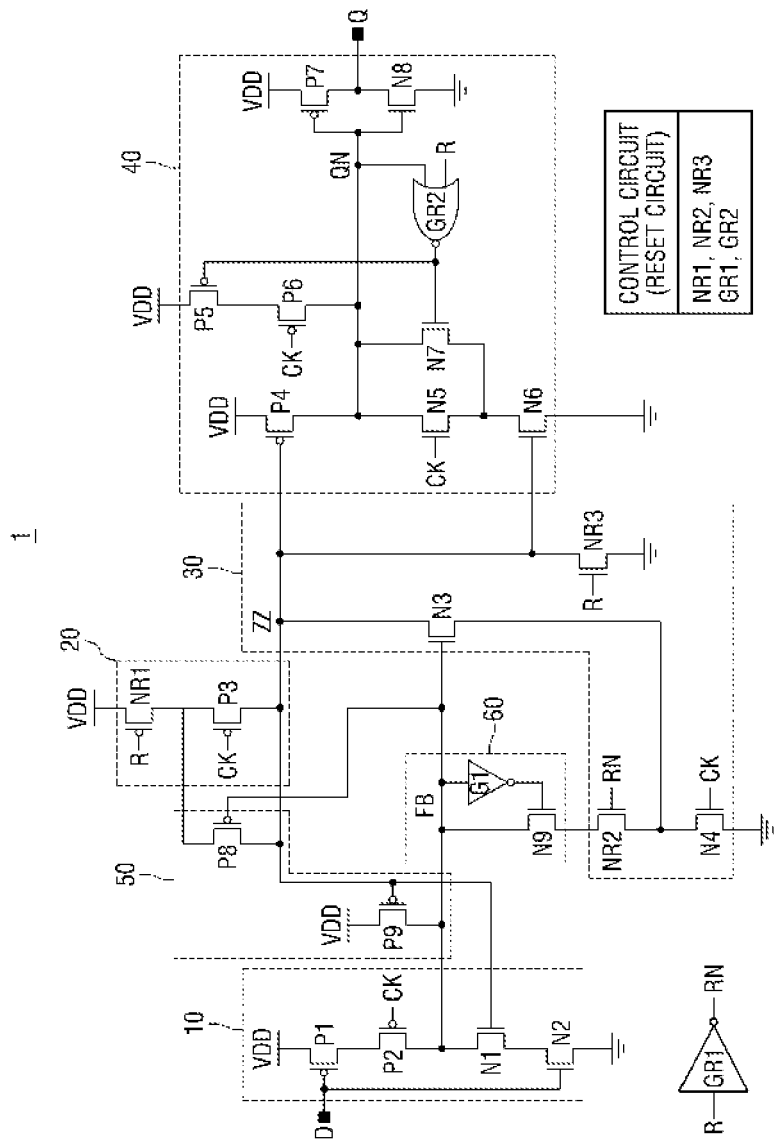
FIG. 1 is a circuit view of a semiconductor circuit according to a first exemplary embodiment.

FIG. 1 is a circuit view of a semiconductor circuit according to a first exemplary embodiment.

Referring to FIG. 1, the semiconductor circuit 1 according to the first exemplary embodiment includes a first circuit 10, a second circuit 20, a third circuit 30, a latch 40, a first keeper circuit 50, a second keeper circuit 60, and control circuits NR1 to NR3 and GR1 and GR2.

The first circuit 10 may determine a voltage level of a feedback node FB based on a voltage level of input data D, a voltage level of a latch input node ZZ, and a voltage level of a clock signal CK.

As shown in FIG. 1, the first circuit 10 may include a transistor P1 gated to the voltage level of the input data D and providing a power voltage VDD, a transistor P2 gated to the voltage level of the clock signal CK and transmitting an output of the transistor P2 to the feedback node FB, a transistor N2 gated to the voltage level of the input data D and providing a ground voltage, and a transistor N1 gated to the voltage level of the latch input node ZZ and transmitting an output of the transistor N2 to the feedback node FB.

In the illustrated embodiment, the transistors P1, P2, N1, and N2 may be connected in series to each other between the power voltage VDD and the ground voltage, but aspects of the exemplary embodiments are not limited thereto. In addition, some transistors P1 and P2 may include, for example, P-type metal-oxide-semiconductor (PMOS) transistors, and the other transistors N1 and N2 may include, for example, N-type metal-oxide-semiconductor (NMOS) transistors, but aspects of the exemplary embodiments are not limited thereto.

The second circuit 20 may pre-charge the latch input node ZZ based on the voltage level of the clock signal CK.

The second circuit 20 may include a transistor P3 gated to the voltage level of the clock signal CK and transmitting the power voltage VDD provided from the transistor NR1 to the latch input node ZZ.

Here, the transistor P3 may include, for example, a PMOS transistor, but aspects of the exemplary embodiments are not limited thereto.

The third circuit 30 may pull down the latch input node ZZ based on the voltage level of the feedback node FB and the voltage level of the clock signal CK.

The third circuit 30 may include a transistor N4 gated to the voltage level of the clock signal CK and providing a ground voltage, and a transistor N3 gated to the voltage level of the feedback node FB and transmitting an output of the transistor N3 to the latch input node ZZ.

Here, the transistors N3 and N4 may include, for example, NMOS transistors, but aspects of the exemplary embodiments are not limited thereto.

The latch 40 may output the output data Q based on the voltage level of the clock signal CK and the voltage level of the latch input node ZZ.

In detail, the latch 40 may include a transistor P4 gated to the voltage level of the latch input node ZZ and providing the power voltage VDD, a transistor N6 gated to the voltage level of the latch input node ZZ and providing the ground voltage, and a transistor N5 gated to the voltage level of the clock signal CK and transmitting an output of the transistor N5 to an inverted output node QN. Here, the transistor N5 may keep a voltage level of the inverted output node QN at the ground voltage.

In addition, the latch 40 may include a transistor P5 gated to an output of an NOR gate GR2 and providing the power voltage VDD, a transistor P6 gated to the voltage level of the clock signal CK and transmitting an output of the transistor P6 to the inverted output node QN, and a transistor N7 gated to the output of the NOR gate GR2 and providing an output of the transistor N7 to the inverted output node QN. Here, the transistor P5 may keep the voltage level of the inverted output node QN at the power voltage VDD.

In addition, the latch 40 may include a transistor P7 gated to the inverted output node QN and may output the power voltage VDD as the output data Q, and a transistor N8 gated to the inverted output node QN and may output the ground voltage as the output data Q.

Here, the transistors P4, N5, and N6 may constitute clock based inverters inverting the voltage level of the latch input node ZZ according to the voltage level of the clock signal CK to provide the inverted voltage level to the inverted output node QN, and the transistors P7 and N8 may constitute inverters inverting the voltage level of the inverted output node QN and outputting the inverted level as the output data Q. However, aspects of the exemplary embodiments are not limited thereto.

In the illustrated embodiment, the transistors P4 to P7 included in the latch 40 may include, for example, PMOS transistors and the transistors N5 to N8 may include, for example, NMOS transistors, but aspects of the exemplary embodiments are not limited thereto. In addition, in the illustrated embodiment, the latch 40 is configured to include the transistors P4 to P7 and the transistors N5 to N8, but aspects of the exemplary embodiments are not limited thereto. The configuration of the latch 40 may vary as necessary.

The control circuits NR1 to NR3 and GR1 and GR2 may control the semiconductor circuit 1 according to the first exemplary embodiment to perform different operations according to a control signal R supplied thereto.

In the illustrated embodiment, the control circuits NR1 to NR3 and GR1 and GR2 may include, for example, reset circuits controlling the semiconductor circuit 1 to perform a reset operation.

The control circuits NR1 to NR3 and GR1 and GR2 may include a transistor NR1 gated to the voltage level of the reset signal R and transmitting the power voltage VDD to the transistor P3, a transistor NR2 gated to the voltage level of the inverted reset signal RN and transmitting an output of the transistor N9 to the transistor N3, a transistor NR3 gated to the voltage level of the reset signal R and providing the ground voltage to the latch input node ZZ, an inverter GR1 inverting the voltage level of the reset signal R and outputting an inverted reset signal RN, and an NOR gate GR2 receiving the voltage level of the inverted output node QN as a first input and the voltage level of the reset signal R as a second input, performing an NOR operation and operating a result of the NOR operation.

In the illustrated embodiment, the transistor NR1 may include, for example, a PMOS transistor and the transistors NR2 and NR3 may include, for example, NMOS transistors. However, aspects of the exemplary embodiments are not limited thereto.

In the illustrated embodiment, as shown, the transistor NR1 may be configured to be included in the second circuit 20, the transistors NR2 and NR3 may be configured to be included in the third circuit 30 and the NOR gate GR2 may be configured to be included in the latch 40.

The first keeper circuit 50 may keep the voltage level of the latch input node ZZ or the feedback node FB at a first level (e.g., a high level, which is to be abbreviated as H, hereinafter).

The first keeper circuit 50 may include a transistor P8 gated to the voltage level of the feedback node FB and providing the power voltage VDD to the latch input node ZZ and a transistor P9 gated to the voltage level of the latch input node ZZ and providing the power voltage VDD to the feedback node FB.

In the illustrated embodiment, the transistors P8 and P9 included in the first keeper circuit 50 may include, for example, PMOS transistors. However, aspects of the exemplary embodiments are not limited thereto.

The second keeper circuit 60 may keep the voltage level of the feedback node FB at a second level (e.g., a low level, which is to be abbreviated as L, hereinafter).

The second keeper circuit 60 may include an inverter G1 inverting the voltage level of the feedback node FB, and a transistor N9 gated to an output of the inverter G1 and providing the ground voltage to the feedback node FB.

In the illustrated embodiment, the transistor N9 included in the second keeper circuit 60 may include, for example, an NMOS transistor. However aspects of the exemplary embodiments are not limited thereto.

In some exemplary embodiments of the exemplary embodiments, the first and second keeper circuits 50 and 60 may not be provided. In other words, the exemplary embodiments do not limit the structure to that shown in FIG. 1.

In the exemplary embodiments, as shown in FIG. 1, the clock signal CK is used for operating the flip-flop while avoiding using the inverted clock signal, thereby avoiding power consumption by an inverting element of the clock signal CK. In addition, use of a transmission gate for transmitting the clock signal CK and an inverted signal of the clock signal or a tri-state inverter is avoided, thereby avoiding switching power consumption due to switching of the clock signal and the inverted clock signal in parasitic capacitors of the transmission gate and a gate capacitor of the tri-state inverter.

In addition, since an internal signal of the flip-flop, which is formed by gating the input data D and the clock signal CK, has data dependency, there is a high probability of reducing switching power, compared to a circuit of switching a clock signal and an inverted clock signal every time. Therefore, the clock signal CK, the input data D, internal signals generated based on the input data D and the clock signal CK and having data dependency are used, thereby achieving low power consumption while maintaining performance of the flip-flop. This circuit architecture technique may also be applied to the following embodiments.

Figure 2:
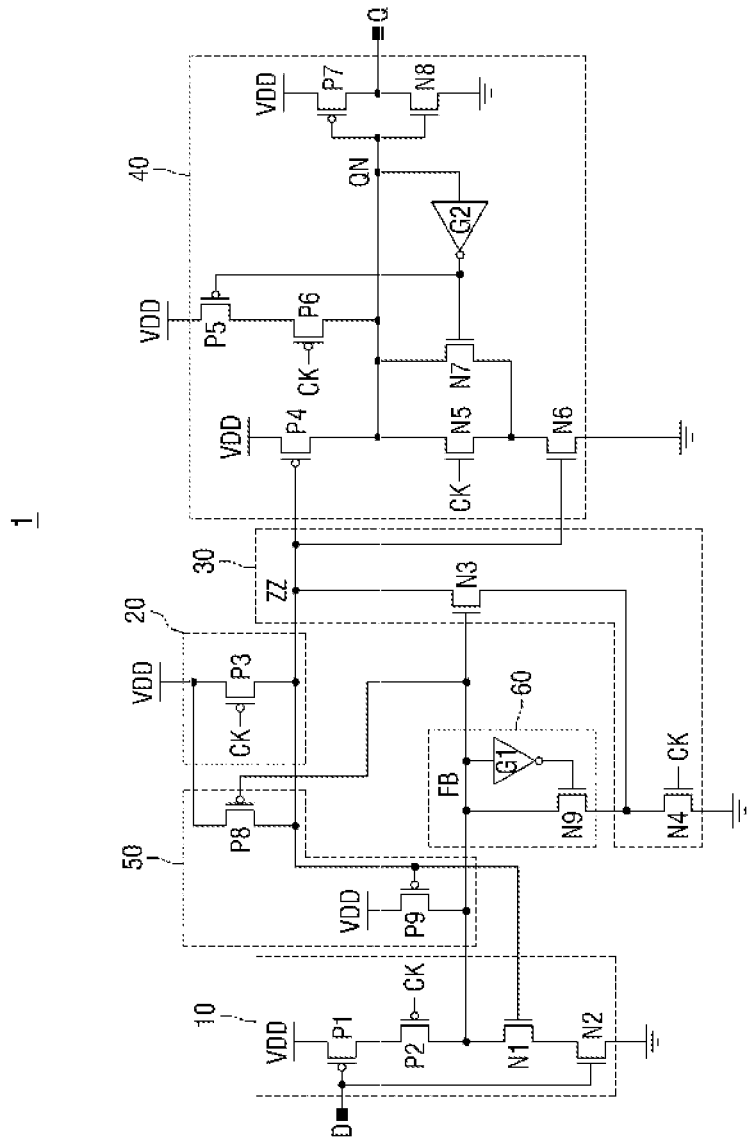
FIGS. 2 and 3 illustrate operations of the semiconductor circuit shown in FIG. 1.
Figure 3:
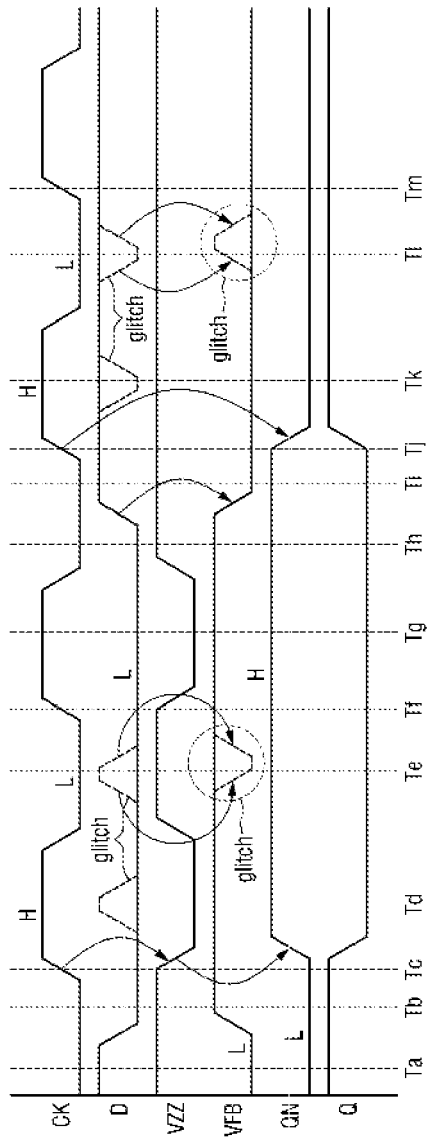

FIGS. 2 and 3 illustrate operations of the semiconductor circuit shown in FIG. 1.

Referring to FIGS. 1 to 3, the semiconductor circuit 1 according to the present embodiment performs the operations listed in Table 1 according to the voltage level of the reset signal R.

TABLE 1

| R | Operation |
| --- | --- |
| L (Inactivated) | Outputting input data D as output data Q according to clock signal CK |
| H (Activated) | Always outputting low level (L) data as output data Q |

First, referring to FIG. 1, when the reset signal R is at second level L, the transistors NR1 and NR2 are turned on and the transistor NR3 is turned off. In this case, the NOR gate GR2 performs a function as an inverter of inverting and outputting the voltage level of the inverted output node QN.

Therefore, the circuit shown in FIG. 1 may be simplified as the circuit shown in FIG. 2. Referring to FIG. 2, it is understood that effects exerted by the transistors NR1 and NR2 shown in FIG. 1 are neglected and the transistor NR3 is removed. In addition, the NOR gate GR2 shown in FIG. 1 is replaced by the inverter G2.

The operation of the semiconductor circuit 1 outputting the input data D as the output data Q according to the clock signal CK will be described in more detail with reference to FIG. 3.

Referring to FIGS. 2 and 3, at a time Ta, when the clock signal CK is at second level L and the input data D is at first level H, the transistors P1, N4, and N5 are turned off and the transistors P3, P6, and N2 are turned on. Since the voltage level of the latch input node ZZ is at a first level H, the transistor N1 is turned on. Therefore, the voltage level of the feedback node FB is at a second level L. Therefore, the transistor N3 is turned off and the transistor P8 is turned on.

Since the voltage level of the latch input node ZZ is at a first level H, the transistor P4 is turned on. Accordingly, the voltage level of the inverted output node QN is activated to the first level H. In addition, since the voltage level of the inverted output node QN is at a first level H, the transistor N8 is turned on. Therefore, the voltage level of the output data Q is inactivated to the second level L.

Next, at a time Tb, when the input data D is at a second level L, the transistor N2 is turned off and the transistor P1 is turned on. Therefore, the voltage level of the feedback node FB makes a transition to a first level H by the transistors P1 and P2. Therefore, the transistor N3 is turned on and the transistor P8 is turned off. The voltage level of the latch input node ZZ is kept at a first level H according to the clock signal CK having a second level L. Therefore, the voltage level of the inverted output node QN and the voltage level of the output data Q are not changed.

Next, at a time Tc, if the clock signal CK makes a transition from a second level L to a first level H, the transistors P2 and P11 are turned off and the transistors N4 and N5 are turned on. Therefore, the voltage level of the latch input node ZZ makes transition from a first level H to a second level L. In such a manner, if the voltage level of the latch input node ZZ makes transition from a first level H to a second level L, the transistor P9 is turned on. Therefore, the voltage level of the feedback node FB is kept at the first level H.

If the voltage level of the latch input node ZZ makes a transition from a first level H to a second level L, the latch 40 latches the voltage level of the latch input node ZZ based on a rising edge of the clock signal CK and outputs the same as the output data Q having the second level L.

In detail, if a rising edge is applied to the clock signal CK while the voltage level of the latch input node ZZ makes a transition from a first level H to a second level L, the transistor P4 is turned off and the transistors N5 and N6 are turned on. Accordingly, the voltage level of the inverted output node QN makes a transition to a first level H. Accordingly, since the transistors P5 and P6 are turned on, the voltage level of the inverted output node QN is kept at a first level H.

If the voltage level of the inverted output node QN is kept at the first level H, the transistor P7 is turned off and the transistor N8 is turned on. Therefore, the output data Q is inactivated to second level L.

Next, at a time Td, even if a glitch occurs to the input data D, the transistors P2 and N1 are kept at turned-off states. Thus, the glitch may not affect the voltage level of the feedback node FB. The voltage level of the feedback node FB is kept at first level H by the transistor P9 included in the first keeper circuit 50.

Next, at a time Te, the voltage level of the clock signal CK is changed to second level L. Here, the transistor P3 is turned on and the transistor N4 is turned off. The voltage level of the latch input node ZZ makes a transition to a first level H by the transistor P3.

Even if the voltage level of the latch input node ZZ makes a transition to a first level H, the voltage level of the clock signal CK is at a second level L, the transistor N5 is turned off. Therefore, the voltage level of the inverted output node QN and the voltage level of the output data Q are not changed.

Meanwhile, when the voltage level of the clock signal CK is changed to a second level L, the transistor P2 is turned on. Therefore, the voltage level of the feedback node FB is kept at a first level H.

However, if the data input D makes a transition from a second level L to a first level H due to the glitch, the transistor P1 is turned off and the transistor N2 is turned on.

If the transistor N2 is turned on by the glitch while the transistor N1 is maintained at a turned-on state, the ground voltage is supplied to the feedback node FB by the transistors N1 and N2. In other words, when the voltage level of the clock signal CK is at a second level L, the glitch contained in the data input D affects the voltage level of the feedback node FB.

When the voltage level of the clock signal CK is at a first level H (e.g., at time Td), the voltage level of the feedback node FB is not synchronized with the data input D. However, when the voltage level of the clock signal CK is at a second level L (e.g., at time Te), the voltage level of the feedback node FB is synchronized with the data input D.

Next, at a time Tf, if the voltage level of the clock signal CK makes transition from a second level L to a first level H, the voltage level of the latch input node ZZ makes transition to a second level L by the transistors N3 and N4. However, as the transistor P4 is turned on, the voltage level of the inverted output node QN is kept at a first level H. Accordingly, the voltage level of the output data Q is kept at a second level L.

Meanwhile, the voltage level of the feedback node FB is kept at a first level H by the transistor P9.

Next, the operation of the semiconductor circuit 1 at the time Tg is the same with that of the semiconductor circuit 1 at the time Td.

Next, at a time Th, when the voltage level of the clock signal CK is second level L, the transistor P3 is turned on and the transistor N4 is turned off. Therefore, the voltage level of the latch input node ZZ makes a transition to a first level H by the transistor P3. However, since the transistor N5 is turned off, the voltage level of the inverted output node QN is kept at a first level H. Accordingly, the voltage level of the output data Q is kept at a second level L.

The voltage level of the feedback node FB is kept at a first level H by the transistors P1 and P2.

However, if the voltage level of the input data D makes a transition from a second level L to a first level H while the voltage level of the clock signal CK is kept at a second level L between the time Th and the time Ti, the transistor P1 is turned off and the transistor N2 is turned on.

Therefore, the ground voltage is supplied to the feedback node FB by the transistors N1 and N2. Therefore, the voltage level of the feedback node FB makes a transition from a first level H to a second level L. In such a manner, if the voltage level of the feedback node FB makes a transition to a second level L, the transistor N3 is turned off and the transistor P8 is turned on. Thus, the voltage level of the latch input node ZZ is kept at a first level H.

Next, at a time Tj, even if the voltage level of the clock signal CK makes transition from a second level L to a first level H, the transistor N3 is maintained at a turned-off state. Thus, the voltage level of the latch input node ZZ is kept at a first level H.

However, since the transistors N1, N2, and N4 are turned on, the voltage level of the feedback node FB makes a transition to a second level L. The second keeper circuit 60 keeps the voltage level of the feedback node FB at a second level L.

The latch 40 latches the input data D having a first level H in response to the rising edge of the clock signal CK and outputs the latched input data as the output data Q having a first level H.

In detail, since the voltage level of the latch input node ZZ is a first level H, the transistor N6 is turned on. If the transistor N5 is turned on in response to the rising edge of the clock signal CK, the voltage level of the inverted output node QN makes a transition to a second level L. Accordingly, since the transistor P7 is turned on, the output data Q makes a transition to a first level H.

Next, even if a glitch occurs to the input data D at a time Tk, the voltage level of the feedback node FB is kept at a second level L by the second keeper circuit 60.

Next, at a time Tl, even if the voltage level of the clock signal CK makes a transition to a second level L, the voltage level of the latch input node ZZ is kept at a first level H by the transistor P8 included in the first keeper circuit 50. In addition, the voltage level of the feedback node FB is also kept at a second level L by the transistors N1 and N2.

However, if the data input D makes a transition from a first level H to a second level L due to the glitch, the transistor N2 is turned off and the transistor P1 is turned on. Therefore, since the transistors P1 and P2 are turned on, the power voltage VDD is supplied to the feedback node FB. Therefore, the voltage level of the feedback node FB may be affected by the glitch contained in the input data D.

Similar to the above description, when the voltage level of the clock signal CK is a first level H (e.g., at time Tk), the voltage level of the feedback node FB is not synchronized with the data input D. However, when the voltage level of the clock signal CK is a second level L (e.g., at time Tl), the voltage level of the feedback node FB is synchronized with the data input D.

Next, at a time Tm, even if the voltage level of the clock signal CK makes a transition from a second level L to a first level H, the voltage level of the latch input node ZZ is kept at a first level H by the transistor P8 and the voltage level of the feedback node FB is also kept at a second level L by the transistors N4 and N9.

The latch 40 latches the input data D having a first level H in response to the rising edge of the clock signal CK and outputs the latched input data as the output data Q having a first level H.

As described above, in the semiconductor device 1 according to the present embodiment, when the reset signal (R of FIG. 1) is at a second level L, the input data D is output as the output data Q by changing the voltage levels of the feedback node FB and the latch input node ZZ. In other words, the semiconductor device 1 according to the present embodiment may perform functions of a normal flip-flop when the reset signal (R of FIG. 1) is at a second level L. As shown in FIG. 3, the input data D may be output as the output data Q after a delay (D-Q Delay) of a predetermined time from the rising edge of the clock signal CK.

Next, referring again to FIG. 1, when the reset signal R is at a first level H, the transistors NR1 and NR2 are turned off and the transistor NR3 is turned on. In this case, an output of the NOR gate GR2 is always at a second level L.

In such a manner, if the transistor NR3 is turned on, the voltage level of the latch input node ZZ is always kept at a second level L. Therefore, the transistor P4 is turned on and the voltage level of the inverted output node QN is always kept at a first level H. In addition, since the voltage level of the inverted output node QN is kept at a first level H, the transistor N8 is turned on, so that the output data Q is kept at a second level L.

As described above, the semiconductor circuit 1 according to the first embodiment may perform both of a normal flip-flop function and a reset function through a simplified structure, it is advantageously capable of operating at a high speed even with low power consumption.

Figure 4:
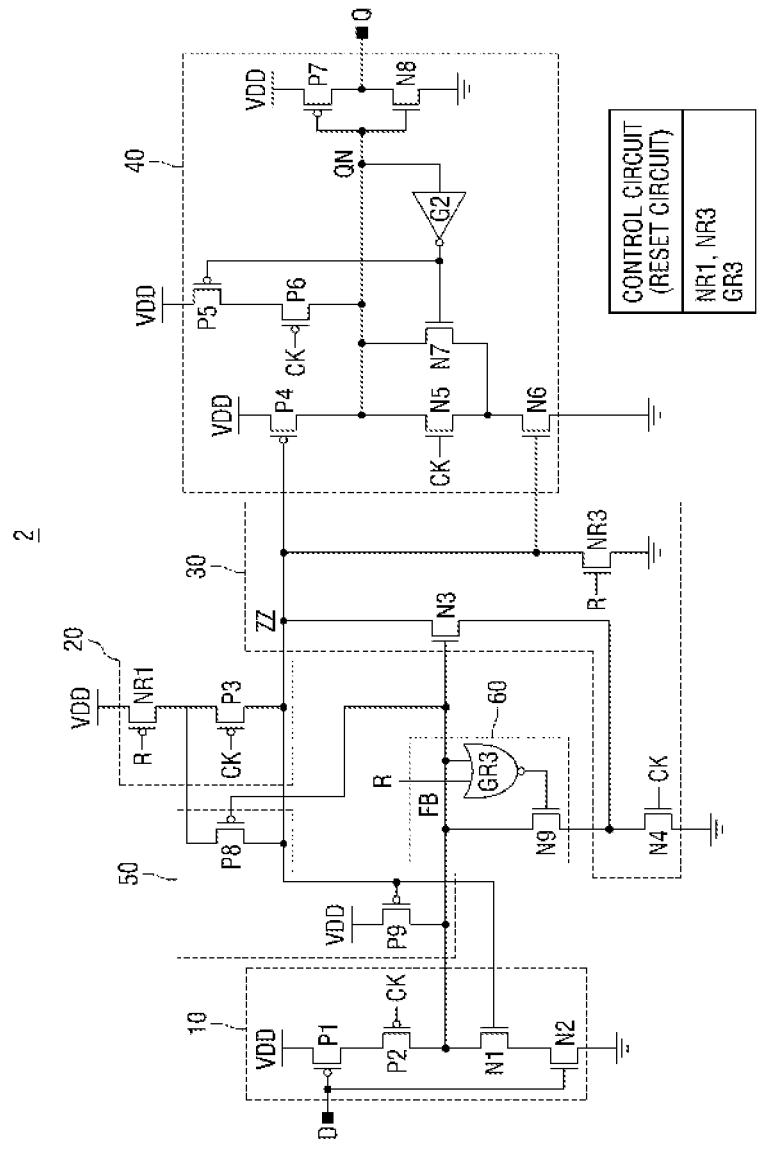
FIG. 4 is a circuit view of a semiconductor circuit according to a second exemplary embodiment.

FIG. 4 is a circuit view of a semiconductor circuit according to a second embodiment. The following description will focus on differences between the present embodiment and the previous embodiment.

Referring to FIG. 4, the semiconductor circuit 2 according to the second embodiment is different from the aforementioned semiconductor circuit (semiconductor circuit 1 of FIG. 1) in view of configurations of control circuits NR1, NR3 and GR3.

That is to say, the control circuits NR1, NR3, and GR3 of the semiconductor device 2 according to the present embodiment may be, for example, reset circuits capable of controlling the semiconductor circuit 2 to perform a reset operation. However, the semiconductor device 2 according to the present embodiment is different from the semiconductor circuit (semiconductor circuit 1 of FIG. 1) according to the previous embodiment in view of configurations.

In detail, the control circuits NR1, NR3, and GR3 may include a transistor NR1 gated to a voltage level of input data D and providing a power voltage VDD to a transistor P3, a transistor NR3 gated to a voltage level of a reset signal R and providing a ground voltage to a latch input node ZZ, and an NOR gate GR3 receiving a voltage level of a feedback node FB as a first input and the voltage level of the reset signal R as a second input, performing an NOR operation and outputting a result of the NOR operation.

In the illustrated embodiment, the transistor NR1 may include, for example, a PMOS transistor and the transistor NR3 may include, for example, an NMOS transistor, but aspects of the exemplary embodiments are not limited thereto.

In the illustrated embodiment, as shown, the transistor NR1 may be configured to be included in a second circuit 20, the transistor NR3 may be configured to be included in a third circuit 30, and the NOR gate GR3 may be configured to be included in a second keeper circuit 60.

A NOR gate (GR2 of FIG. 1) included in a latch (latch 40 of FIG. 1) of the semiconductor circuit (semiconductor circuit 1 of FIG. 1) may be modified as an inverter G2, as shown.

The semiconductor circuit 2 according to the present embodiment performs the operations listed in Table 2 according to the voltage level of the reset signal R.

TABLE 2

| R | Operation |
| --- | --- |
| L (Inactivated) | Outputting input data D as output data Q according to clock signal CK |
| H (Activated) | Always outputting low level (L) data as output data Q |

First, referring to FIG. 4, when the reset signal R is at second level L, the transistor NR1 is turned on and the transistor NR3 is turned off. In this case, the NOR gate GR3 performs a function as an inverter for inverting the voltage level of the feedback node FB and outputting the inverted voltage level.

Therefore, when the reset signal R is at second level L, the semiconductor circuit 2 may have the same configuration with that shown in FIG. 2. Accordingly, as described above, the semiconductor circuit 2 may perform functions of a normal flip-flop.

Next, referring to FIG. 4, when the reset signal R is at a first level H, the transistor NR1 is turned off and the transistor NR3 is turned on. In this case, an output of the NOR gate GR3 is always at a second level L.

As described above, if the transistor NR3 is turned on, the voltage level of the latch input node ZZ is always kept at a second level L. Therefore, the transistor P4 is turned on, so that a voltage level of an inverted output node QN is always kept at a first level H. In addition, since the voltage level of the inverted output node QN is kept at first level H, the transistor N8 is turned on, so that the output data Q is kept at second level L.

As described above, like the semiconductor circuit 1 according to the first embodiment, the semiconductor circuit 2 according to the second embodiment may perform both a normal flip-flop function and a reset function through a simplified structure. Therefore, the semiconductor circuit 2 is capable of operating at a high speed even with low power consumption.

Figure 5:
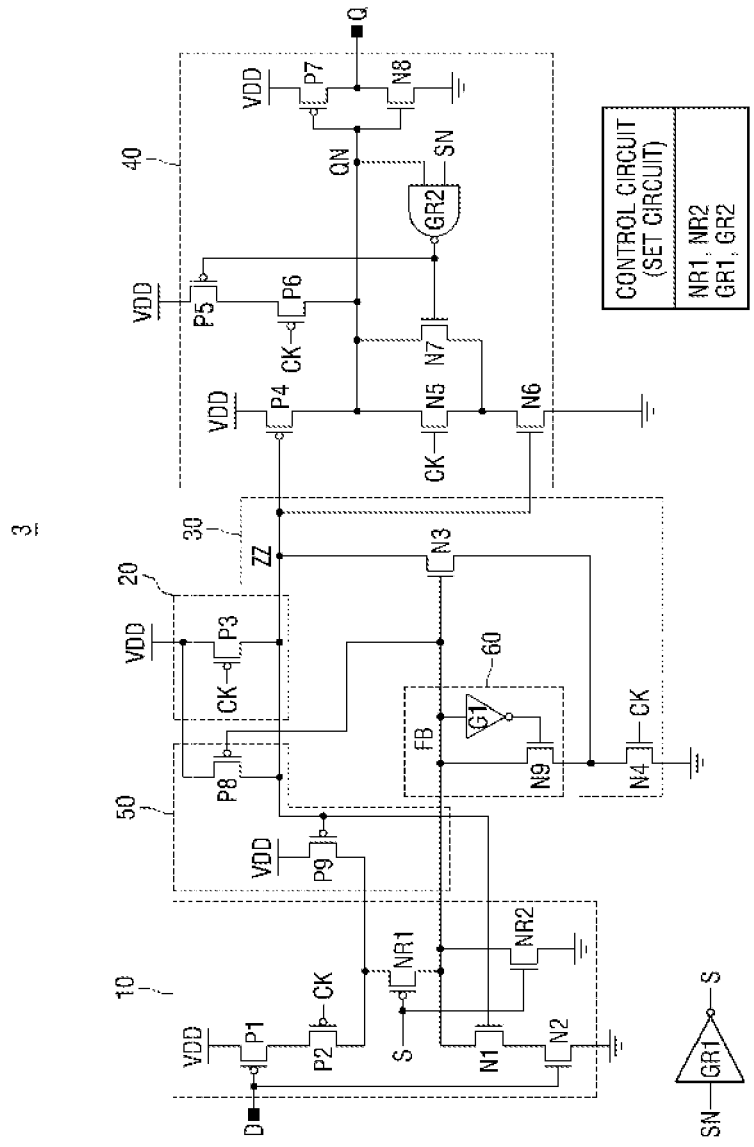
FIG. 5 is a circuit view of a semiconductor circuit according to a third exemplary embodiment.

FIG. 5 is a circuit view of a semiconductor circuit according to a third embodiment. The following description will focus on differences between the present embodiment and the previous embodiments.

Referring to FIG. 5, the semiconductor circuit 3 according to the third embodiment is different from the aforementioned semiconductor circuits in view of configurations of control circuits NR1, NR2, GR1 and GR2. The control circuits NR1, NR2, GR1 and GR2 of the semiconductor device 3 according to the present embodiment may be, for example, reset circuits capable of controlling the semiconductor circuit 3 to perform a set operation.

In detail, the control circuits NR1, NR2, GR1, and GR2 may include a transistor NR1 gated to a set signal S and connecting the transistor P2 to the feedback node FB, a transistor NR2 gated to the set signal S and connecting the feedback node FB to the ground voltage, an inverter GR1 inverting a voltage level of an inverted set signal SN and outputting the set signal S, and an NAND gate GR2 receiving the inverted set signal SN as a first input and a voltage level of an inverted output node QN as a second input, performing an NAND operation and operating a result of the NAND operation.

In the illustrated embodiment, the transistor NR1 may include, for example, a PMOS transistor and the transistor NR2 may include, for example, an NMOS transistor, but aspects of the exemplary embodiments are not limited thereto.

In the illustrated embodiment, as shown, the transistors NR1 and NR2 may be configured to be included in a first circuit 20 and the NAND gate GR2 may be configured to be included in the latch 40.

The semiconductor circuit 3 according to the present embodiment performs the operations listed in Table 3 according to the voltage level of the set signal S.

TABLE 3

| S | Operation |
| --- | --- |
| L (Inactivated) | Outputting input data D as output data Q according to clock signal CK |
| H (Activated) | Always outputting high level (H) data as output data Q |

First, referring to FIG. 5, when the set signal S is at a second level L, the transistor NR1 is turned on and the transistor NR2 is turned off. In this case, the NAND gate GR2 performs a function as an inverter of inverting and outputting the voltage level of the inverted output node QN.

Therefore, when the set signal S is at a second level L, the semiconductor circuit 3 according to the third embodiment may have the same configuration with that shown in FIG. 2. Accordingly, as described above, the semiconductor circuit 3 may perform functions of a normal flip-flop.

Next, referring to FIG. 5, when the set signal S is at a first level H, the transistor NR1 is turned off and the transistor NR2 is turned on. In this case, an output of the NAND gate GR2 is always at a first level H, irrespective of the voltage level of the inverted output node QN.

In such a manner, if the transistor NR2 is turned on, the voltage level of the feedback node FB is always kept at a second level L. Therefore, since the transistor P8 is turned on, the voltage level of the latch input node ZZ inverted output node QN is kept at a first level H. Therefore, the transistor N6 is turned on. Since the output of the NAND gate GR2 is at a first level H, the transistor N7 is also turned on. Therefore, the voltage level of the inverted output node QN is kept at a second level L. Accordingly, the transistor P7 is turned on, so that the output data Q is kept at first level H.

As described above, like the semiconductor circuit 1 according to the first embodiment, the semiconductor circuit 3 according to the third embodiment may perform both a normal flip-flop function and a reset function through a simplified structure. Thus, the semiconductor circuit 3 is capable of operating at a high speed even with low power consumption.

Figure 6:
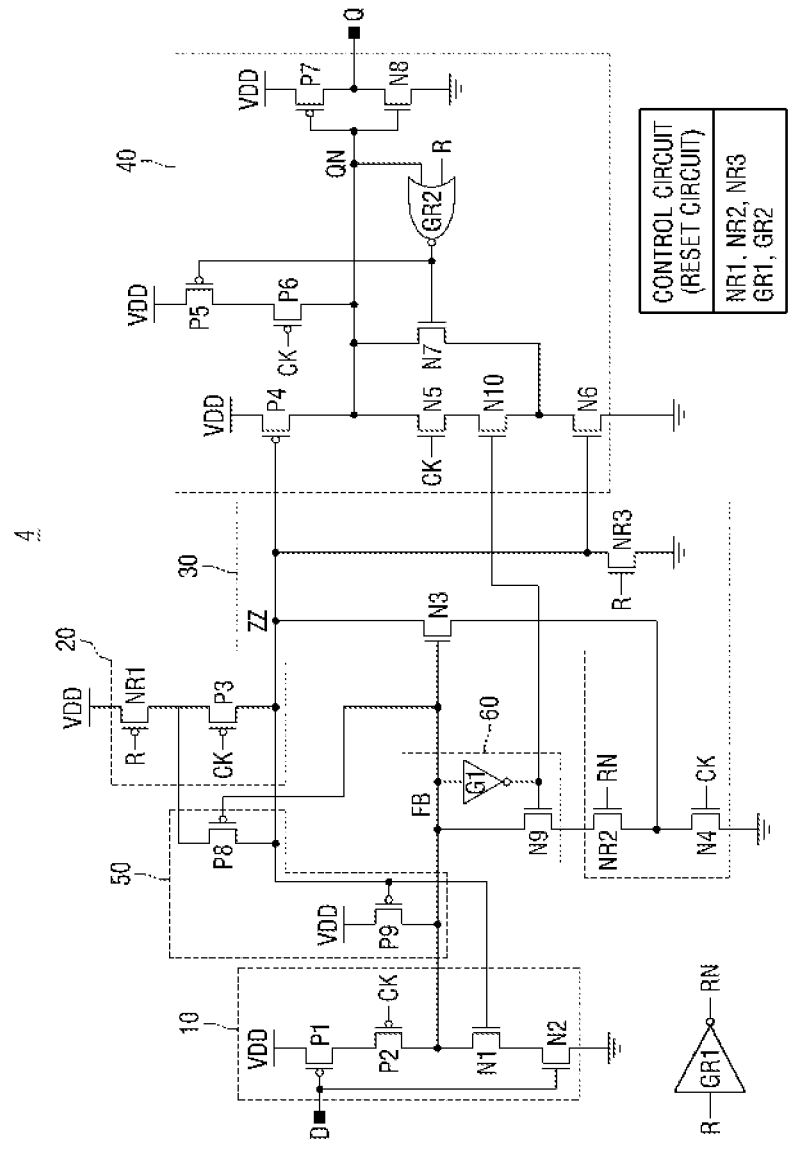
FIG. 6 is a circuit view of a semiconductor circuit according to a fourth exemplary embodiment.

FIG. 6 is a circuit view of a semiconductor circuit according to a fourth embodiment. The following description will focus on differences between the present embodiment and the previous embodiments.

Referring to FIG. 6, the semiconductor circuit 4 according to the fourth embodiment may further include a transistor N10 provided in a latch 40, compared to the semiconductor circuit (semiconductor circuit 1 of FIG. 1).

The transistor N10 included in the latch 40 may be gated to an output of an inverter G1 included in a second keeper circuit 60 and may connect a transistor N5 to a transistor N6. As shown, a gate terminal of the transistor N10 included in the latch 40 may be connected to a gate terminal of a transistor N9 included in the second keeper circuit 60. Therefore, when the transistor N9 included in the second keeper circuit 60 is turned on, the transistor N10 included in the latch 40 may be turned on, and when the transistor N9 included in the second keeper circuit 60 is turned off, the transistor N10 included in the latch 40 may be turned off.

The transistor N10 may effectively block a glitch supplied from the clock signal CK or generated due to a fluctuation in the voltage level of a latch input node ZZ. In detail, even if the transistor N5 or the transistor N6 is turned on by the glitch supplied from the clock signal CK or generated due to a fluctuation in the voltage level of the latch input node ZZ, the transistor N10 is maintained at a turned-off state, thereby preventing the voltage level of the inverted output node QN from being lowered.

Since descriptions of the other components are the same as those of the semiconductor circuit (semiconductor circuit 1 of FIG. 1), repeated explanations thereof will not be made.

Figure 7:
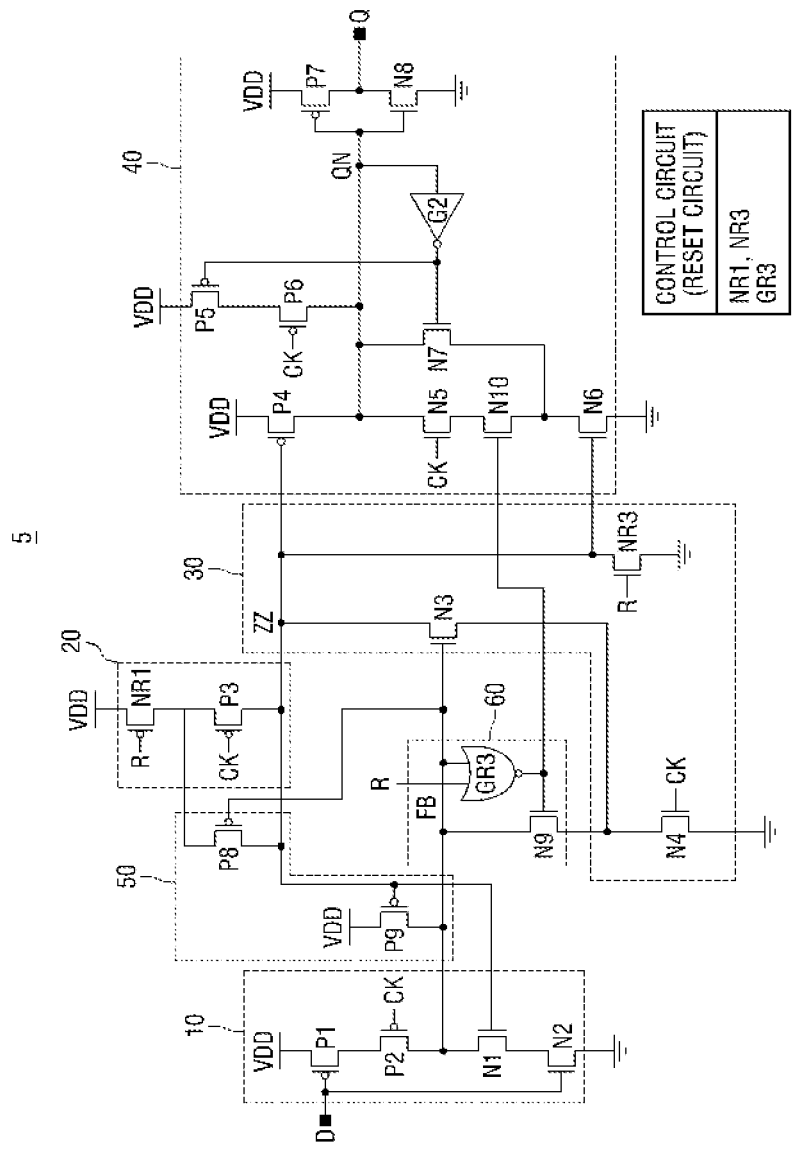
FIG. 7 is a circuit view of a semiconductor circuit according to a fifth exemplary embodiment.

FIG. 7 is a circuit view of a semiconductor circuit according to a fifth embodiment. The following description will focus on differences between the present embodiment and the previous embodiments.

Referring to FIG. 7, the semiconductor circuit 5 according to the fifth embodiment may further include a transistor N10 provided in a latch 40, compared to the semiconductor circuit (semiconductor circuit 2 of FIG. 2).

As described above, the transistor N10 may also effectively block a glitch supplied from the clock signal CK or generated due to a fluctuation in the voltage level of a latch input node ZZ.

Since descriptions of the other components are the same as those of the semiconductor circuit (semiconductor circuit 2 of FIG. 4), repeated explanations thereof will not be made.

Figure 8:
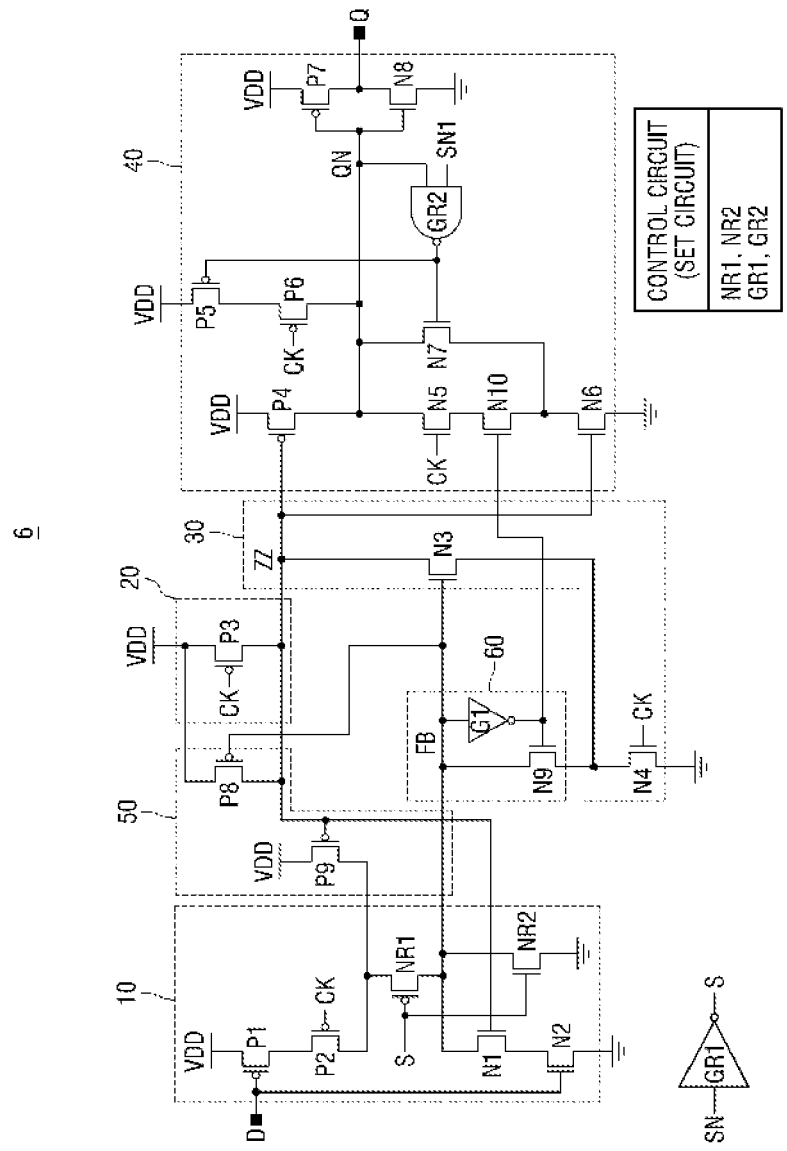
FIG. 8 is a circuit view of a semiconductor circuit according to a sixth exemplary embodiment.

FIG. 8 is a circuit view of a semiconductor circuit according to a sixth embodiment. The following description will focus on differences between the present embodiment and the previous embodiments.

Referring to FIG. 8, the semiconductor circuit 6 according to the sixth embodiment may further include a transistor N10 provided in a latch 40, compared to the semiconductor circuit (semiconductor circuit 3 of FIG. 5).

As described above, the transistor N10 may also effectively block a glitch supplied from the clock signal CK or generated due to a fluctuation in the voltage level of a latch input node ZZ.

Figure 9:
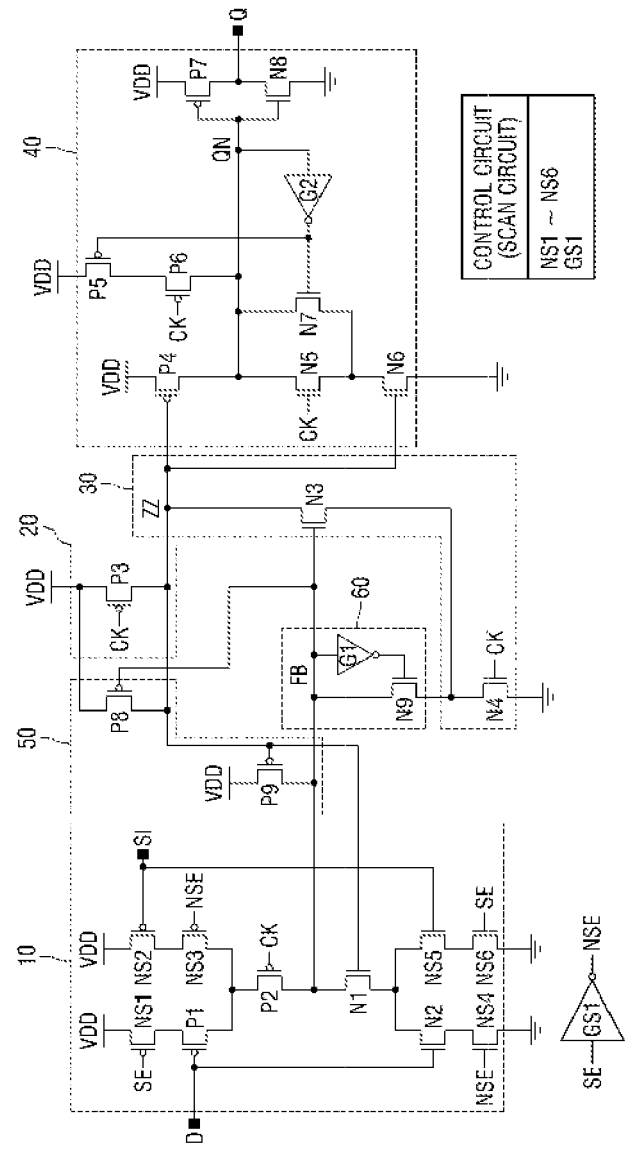
FIG. 9 is a circuit view of a semiconductor circuit according to a seventh exemplary embodiment.

FIG. 9 is a circuit view of a semiconductor circuit according to a seventh embodiment. The following description will focus on differences between the present embodiment and the previous embodiments.

Referring to FIG. 9, the semiconductor circuit 7 according to the seventh embodiment is different from the aforementioned semiconductor circuits in view of configurations of control circuits NS1 to NS6 and GS1. The semiconductor circuit 7 according to the present embodiment may be, for example, a scan circuit controlling the semiconductor circuit 7 to perform a scan operation.

In detail, the control circuits NS1 to NS6 and GS1 may include a transistor NS1 gated to a scan signal SE and providing a power voltage VDD to the transistor P1, a transistor NS2 gated to a scan input signal SI and providing the power voltage VDD, a transistor NS3 gated to an inverted scan signal NSE and transmitting an output of the transistor NS2 to a transistor P2, a transistor NS4 gated to the inverted scan signal NSE and transmitting a ground voltage to the transistor N2, a transistor NS6 gated to the scan signal SE and providing the ground voltage, a transistor NS5 gated to the scan input signal SI and transmitting an output of the transistor NS6 to the transistor N1, and an inverter GS1 inverting a voltage level of the scan signal SE and outputting the inverted scan signal NSE.

In the illustrated embodiment, the transistors NS1 to NS3 may include, for example, PMOS transistors and the transistors NS4 to NS6 may include, for example, NMOS transistors, but aspects of the exemplary embodiments are not limited thereto.

In the illustrated embodiment, as shown, the transistors NS1 to NS6 may be configured to be included in a first circuit 20.

The semiconductor circuit 7 according to the present embodiment performs the operations listed in Table 4 according to the voltage level of the scan signal SE.

TABLE 4

| S | Operation |
| --- | --- |
| L (Inactivated) | Outputting input data D as output data Q according to clock signal CK |
| H (Activated) | Outputting scan input signal SI as output |

TABLE 4-continued

| S | Operation |
|---|---|
|   | data Q according to clock signal CK |

First, referring to FIG. 9, when the scan signal SE is at second level L, the transistors NS1 and NS4 are turned on and the transistors NS3 and NS6 are turned off. In this case, the semiconductor circuit 7 according to the seventh embodiment may have the same configuration with that shown in FIG. 2. Accordingly, as described above, the semiconductor circuit 7 may perform functions of a normal flip-flop.

Next, referring to FIG. 9, when the scan signal SE is at first level H, the transistors NS1 and NS4 are turned off and the transistors NS3 and NS6 are turned on. Accordingly, the semiconductor circuit 7 according to the seventh embodiment has a configuration modified from the semiconductor circuit shown in FIG. 2, such that the input data D is changed into the scan input signal SI.

Accordingly, the semiconductor circuit 7 may perform a normal flip-flop function of outputting the scan input signal SI as output data Q according to the clock signal CK.

As described above, the semiconductor circuit 7 according to the seventh embodiment may perform both a normal flip-flop function and a reset function by a simplified structure. Therefore, the semiconductor circuit 7 is capable of operating at a high speed even with low power consumption.

Figure 10:
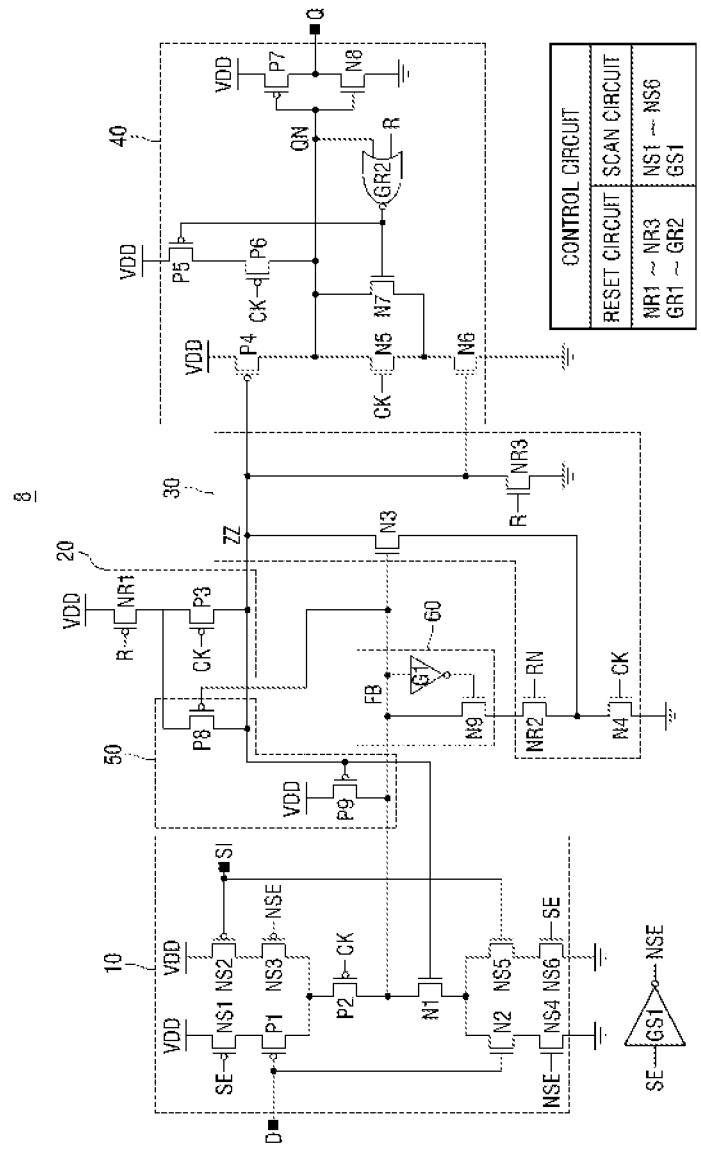
FIG. 10 is a circuit view of a semiconductor circuit according to an eighth exemplary embodiment.

FIG. 10 is a circuit view of a semiconductor circuit according to an eighth embodiment. The following description will focus on differences between the present embodiment and the previous embodiments.

Referring to FIG. 10, control circuits NR1 to NR3, GR1 and GR2, NS1 to NS6 and GS1 of the semiconductor circuit 8 according to the eighth embodiment may include all of the aforementioned reset circuits (NR1 to NR3 and GR1 and GR2 of FIG. 1) and the scan circuits (NS1 to NS6 and GS1 of FIG. 9).

Accordingly, the semiconductor circuit 8 according to the present embodiment performs the operations listed in Table 5 according to the voltage levels of the reset signal R and the scan signal SE.

TABLE 5

| R | SE | Operation |
|---|----|-----------|
| L | L  | Outputting input data D as output data Q according to clock signal CK |
| H | L  | Always outputting low level (L) data as output data Q |
| L | H  | Outputting scan input signal SI as output data Q according to clock signal CK |
| H | H  | Always outputting low level (L) data as output data Q |

That is to say, the semiconductor circuit 8 may perform a reset operation according to the voltage level of the reset signal R and a scan operation according to the voltage level of the scan signal SE.

Figure 11:
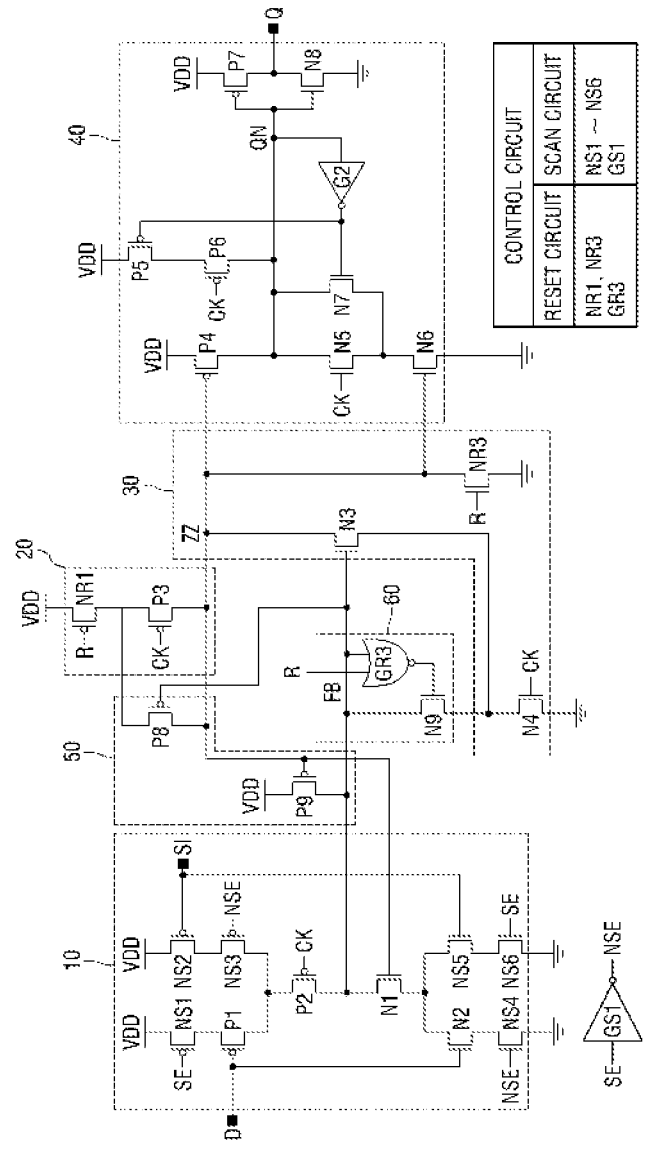
FIG. 11 is a circuit view of a semiconductor circuit according to a ninth exemplary embodiment.

FIG. 11 is a circuit view of a semiconductor circuit according to a ninth embodiment. The following description will focus on differences between the present embodiment and the previous embodiments.

Referring to FIG. 11, control circuits NR1, NR3, GR3, NS1 to NS6, GS1 of the semiconductor circuit 9 according to the ninth embodiment may include all of the aforementioned reset circuits (NR1, NR3 and GR3 of FIG. 4) and the scan circuits (NS1 to NS6 and GS1 of FIG. 9).

Accordingly, the semiconductor circuit 9 according to the present embodiment performs the operations listed in Table 5 according to the voltage levels of the reset signal R and the scan signal SE.

Figure 12:
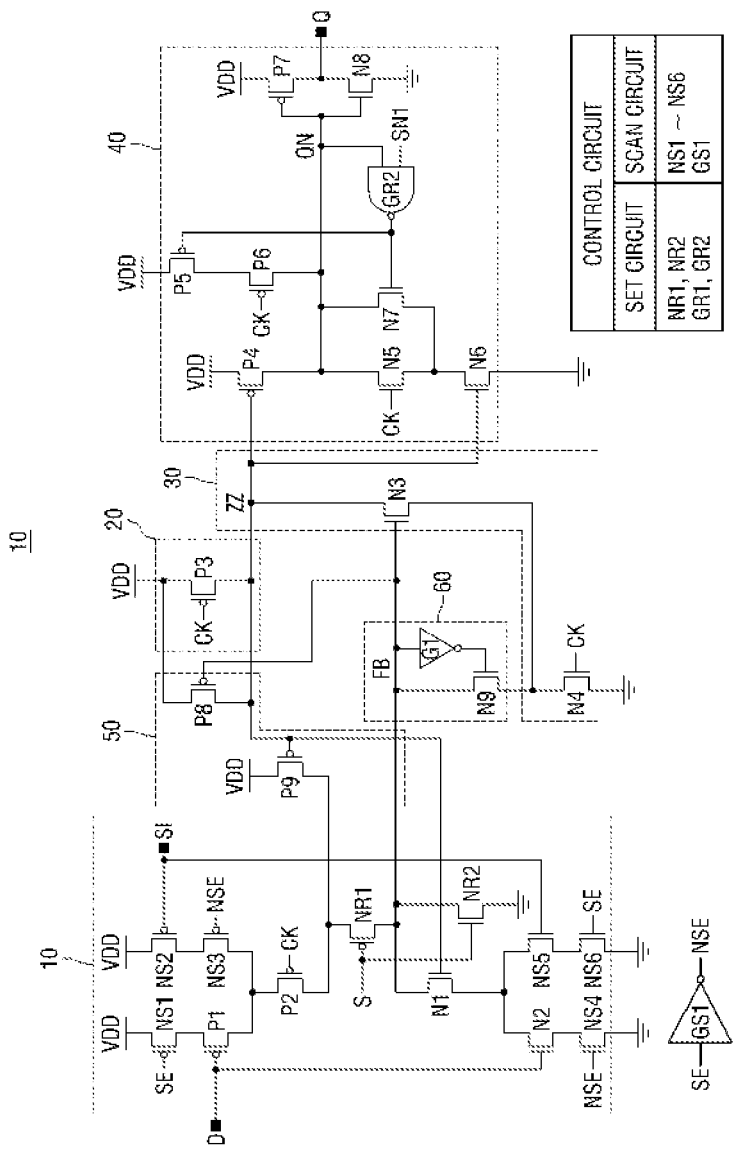
FIG. 12 is a circuit view of a semiconductor circuit according to a tenth exemplary embodiment.

FIG. 12 is a circuit view of a semiconductor circuit according to a tenth embodiment. The following description will focus on differences between the present embodiment and the previous embodiments.

Referring to FIG. 12, control circuits NR1, NR2, GR1, GR2, NS1 to NS6 and GS1 of the semiconductor circuit 10 according to the tenth embodiment may include all of the aforementioned set circuits (NR1, NR2, GR1, and GR2 of FIG. 5) and the scan circuit (NS1 to NS6 and GS1 of FIG. 9).

Accordingly, the semiconductor circuit 10 according to the present embodiment performs the operations listed in Table 6 according to the voltage levels of the set signal S and the scan signal SE.

TABLE 6

| S | SE | Operation |
|---|----|-----------|
| L | L  | Outputting input data D as output data Q according to clock signal CK |
| H | L  | Always outputting high level (H) data as output data Q |
| L | H  | Outputting scan input signal SI as output data Q according to clock signal CK |
| H | H  | Always outputting high level (H) data as output data Q |

That is to say, the semiconductor circuit 10 according to the tenth embodiment may perform a set operation according to the voltage level of the set signal S and a scan operation according to the voltage level of the scan signal SE.

Figure 13:
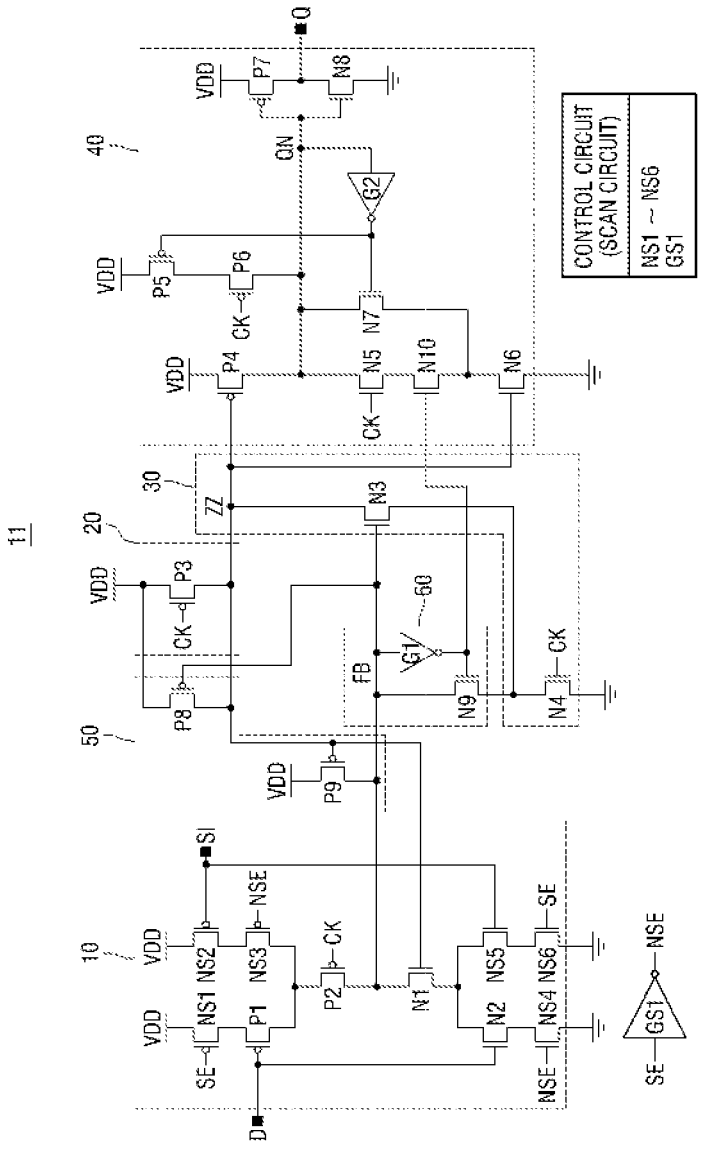
FIG. 13 is a circuit view of a semiconductor circuit according to an eleventh exemplary embodiment.

FIG. 13 is a circuit view of a semiconductor circuit according to an 11th embodiment. The following description will focus on differences between the present embodiment and the previous embodiments.

Referring to FIG. 13, the semiconductor circuit 11 according to the 11th embodiment may further include a transistor N10 provided in a latch 40, compared to the semiconductor circuit (7 of FIG. 9). As described above, the transistor N10 may also effectively block a glitch supplied from the clock signal CK or generated due to a fluctuation in the voltage level of a latch input node ZZ.

Figure 14:
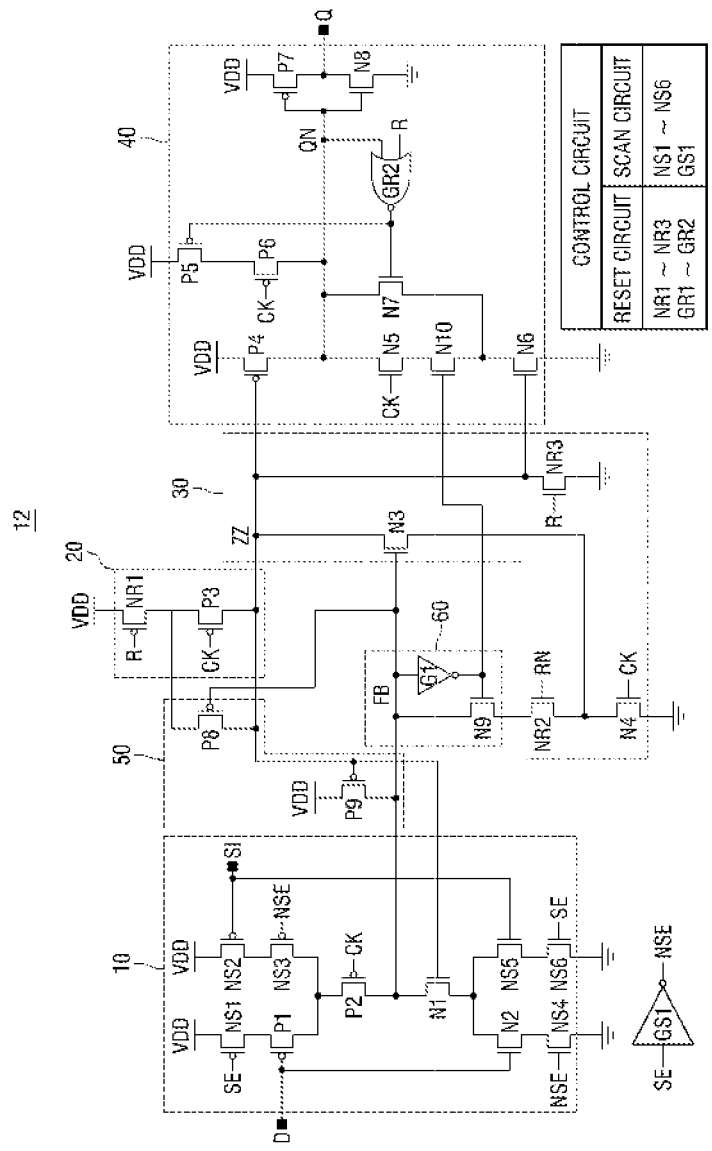
FIG. 14 is a circuit view of a semiconductor circuit according to a twelfth exemplary embodiment.

FIG. 14 is a circuit view of a semiconductor circuit according to a 12th embodiment. The following description will focus on differences between the present embodiment and the previous embodiments.

Referring to FIG. 14, the semiconductor circuit 12 according to the 12th embodiment may further include a transistor N10 provided in a latch 40, compared to the semiconductor circuit (semiconductor circuit 8 of FIG. 10). As described above, the transistor N10 may also effectively block a glitch supplied from the clock signal CK or generated due to a fluctuation in the voltage level of a latch input node ZZ.

Figure 15:
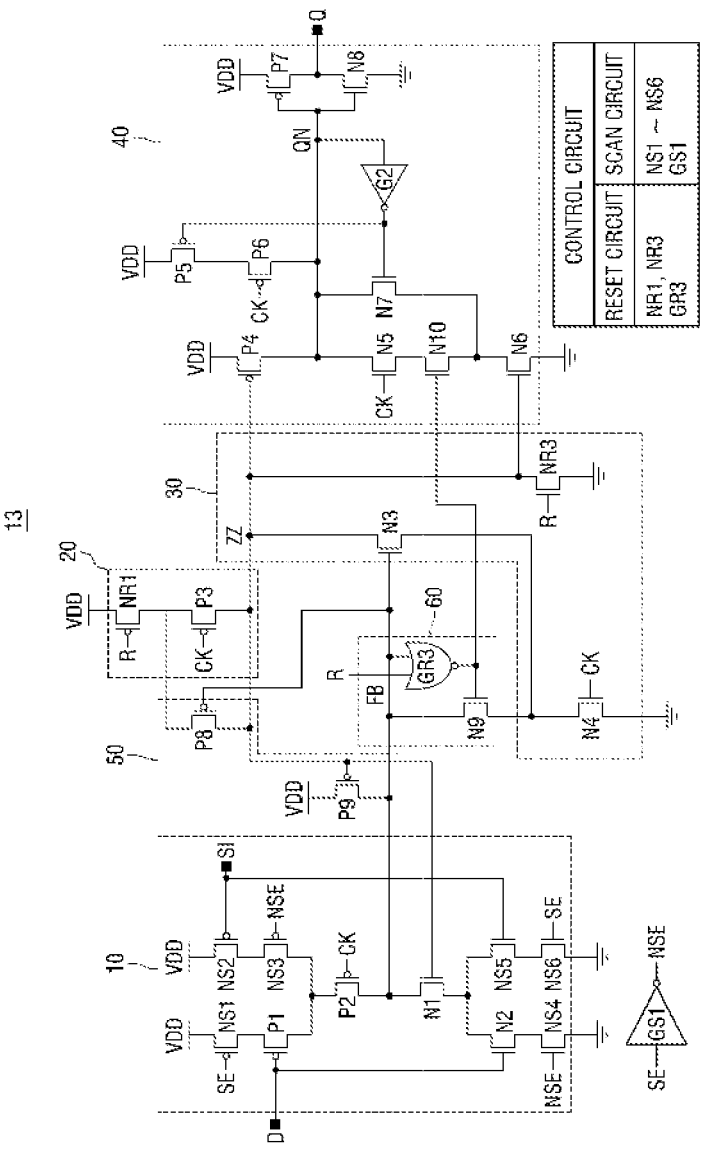
FIG. 15 is a circuit view of a semiconductor circuit according to a thirteenth exemplary embodiment.

FIG. 15 is a circuit view of a semiconductor circuit according to a 13th embodiment. In the following description will focus on differences between the present embodiment and the previous embodiments.

Referring to FIG. 15, the semiconductor circuit 13 according to the 13th embodiment may further include a transistor N10 provided in a latch 40, compared to the semiconductor circuit (semiconductor circuit 9 of FIG. 11). As described above, the transistor N10 may also effectively block a glitch supplied from the clock signal CK or generated due to a fluctuation in the voltage level of a latch input node ZZ.

Figure 16:
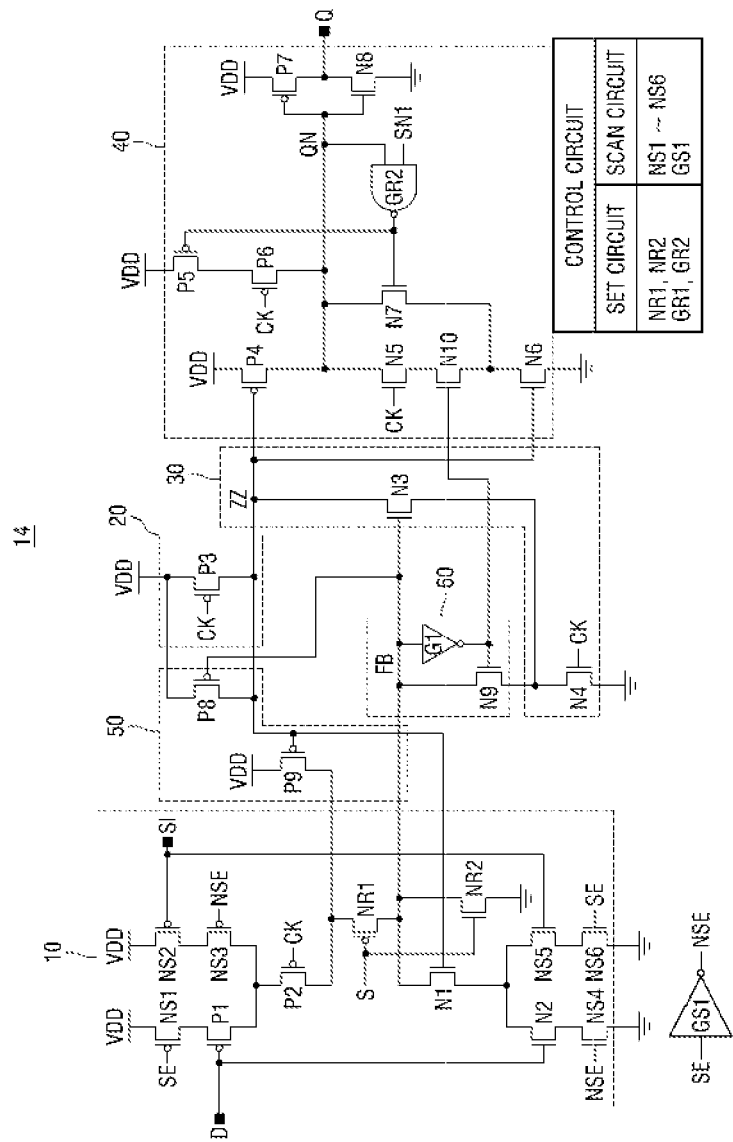
FIG. 16 is a circuit view of a semiconductor circuit according to a fourteenth exemplary embodiment.

FIG. 16 is a circuit view of a semiconductor circuit according to a 14th embodiment. The following description will focus on differences between the present embodiment and the previous embodiments.

Referring to FIG. 16, the semiconductor circuit 14 according to the 14th embodiment may further include a transistor N10 provided in a latch 40, compared to the semiconductor circuit (semiconductor circuit 10 of FIG. 12). As described above, the transistor N10 may also effectively block a glitch supplied from the clock signal CK or generated due to a fluctuation in the voltage level of a latch input node ZZ.

Figure 17:
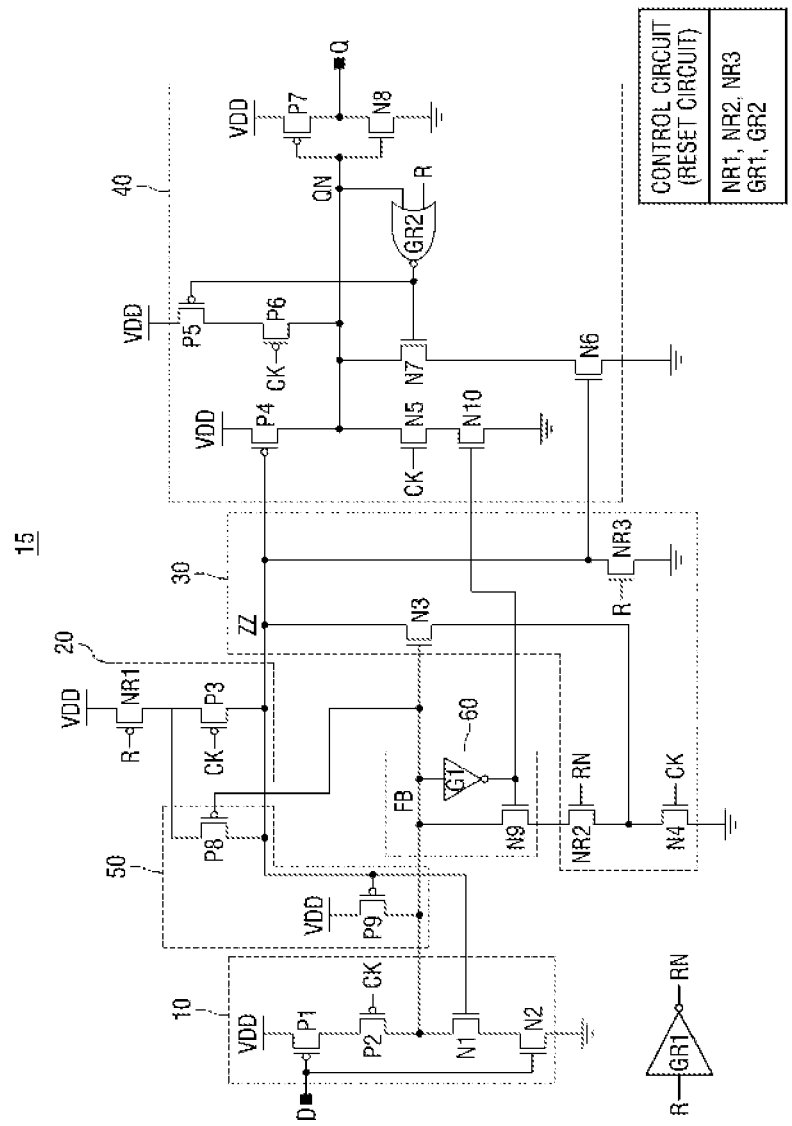
FIG. 17 is a circuit view of a semiconductor circuit according to a fifteenth exemplary embodiment.

FIG. 17 is a circuit view of a semiconductor circuit according to a 15th embodiment. The following description will focus on differences between the present embodiment and the previous embodiments.

Referring to FIG. 17, the semiconductor circuit 15 according to the 15th embodiment is different from the semiconductor circuit 4 shown in FIG. 6 in view of a configuration of a latch 40.

In detail, unlike in the semiconductor circuit 4, the transistor N6 included in the latch 40 of the semiconductor circuit 15 may be connected to the transistor N7 but may not be connected to the transistor N10. In other words, a drain of the transistor N6 may be connected to a source of the transistor N7 but may not be connected to a source of the transistor N10.

In such a manner, if the transistor N6 is separated from the transistor N10, a layout area of the semiconductor circuit 15 may be reduced. In addition, unlike in the semiconductor circuit 4, the transistor N5 and the transistor N10 are configured to have a two-stack structure. Therefore, low-voltage operating characteristics can be improved.

Figure 18:
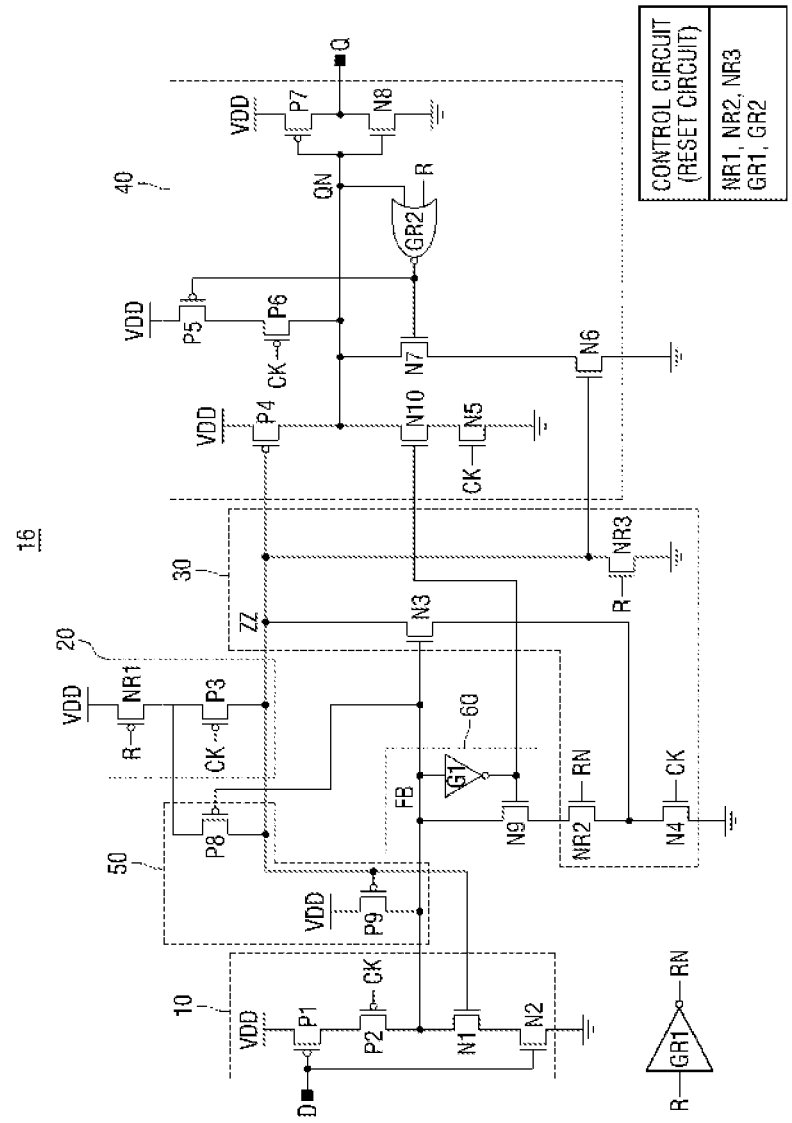
FIG. 18 is a circuit view of a semiconductor circuit according to a sixteenth exemplary embodiment.

FIG. 18 is a circuit view of a semiconductor circuit according to a 16th embodiment. In the following description will focus on differences between the present embodiment and the previous embodiments.

Referring to FIG. 18, the semiconductor circuit 16 according to the 16th embodiment is different from the semiconductor circuit 15 shown in FIG. 17 in view of a connection order of a transistor N5 and a transistor N10. In other words, unlike in the aforementioned semiconductor circuit 15 in which a source of the transistor N5 and a drain of the transistor N10 are connected, a drain of the transistor N5 and a source of the transistor N10 are connected in the semiconductor circuit 16 according to the present embodiment.

Figure 19:
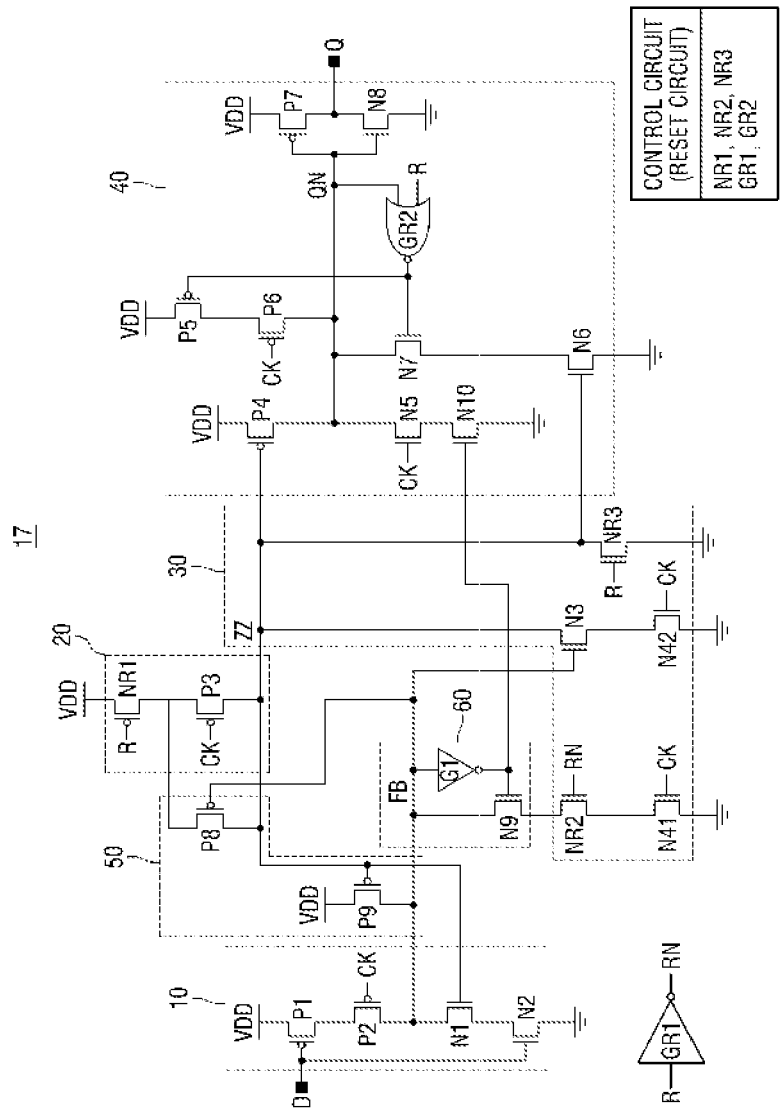
FIG. 19 is a circuit view of a semiconductor circuit according to a seventeenth exemplary embodiment.

FIG. 19 is a circuit view of a semiconductor circuit according to a 17th embodiment. The following description will focus on differences between the present embodiment and the previous embodiments.

Referring to FIG. 19, the semiconductor circuit 17 according to the 17th embodiment is different from the semiconductor circuit 15 shown in FIG. 17 in view of a configuration of a third circuit 30.

In detail, while the third circuit 30 of the semiconductor circuit 15 includes a transistor N3 and a transistor N4 connected to a transistor NR2 (see FIG. 17), the third circuit 30 of the semiconductor circuit 17 may include a transistor N41 connected to a transistor NR2 and a transistor N42 connected to a transistor N3 (see FIG. 19). In other words, the transistor N4 of the third circuit 30 of the semiconductor circuit 17 may be implemented to be separated into the transistor N41 and the transistor N42 of the third circuit 30 of the semiconductor circuit 15. The transistor N41 may be gated to a voltage level of the clock signal CK and may keep a voltage level of a feedback node FB at a ground voltage.

Figure 20:
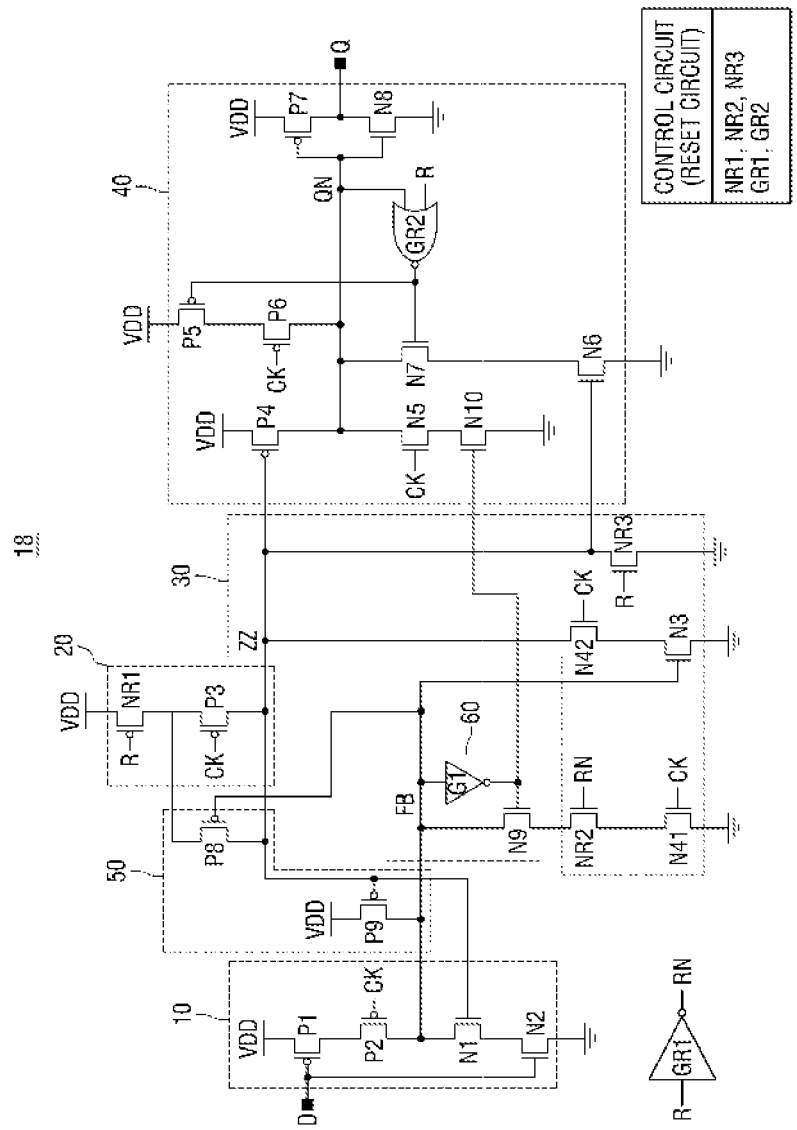
FIG. 20 is a circuit view of a semiconductor circuit according to an eighteenth exemplary embodiment.

FIG. 20 is a circuit view of a semiconductor circuit according to an 18th embodiment. The following description will focus on differences between the present embodiment and the previous embodiments.

Referring to FIG. 20, the semiconductor circuit 18 according to the 18th embodiment is different from the semiconductor circuit 17 shown in FIG. 19 in view of a connection order of a transistor N3 and a transistor N42. In other words, unlike in the aforementioned semiconductor circuit 17 shown in FIG. 19, in which a source of the transistor N3 and a drain of the transistor N42 are connected, a drain of the transistor N3 and a source of the transistor N42 are connected in the semiconductor circuit 18 according to the present embodiment.

Figure 21:
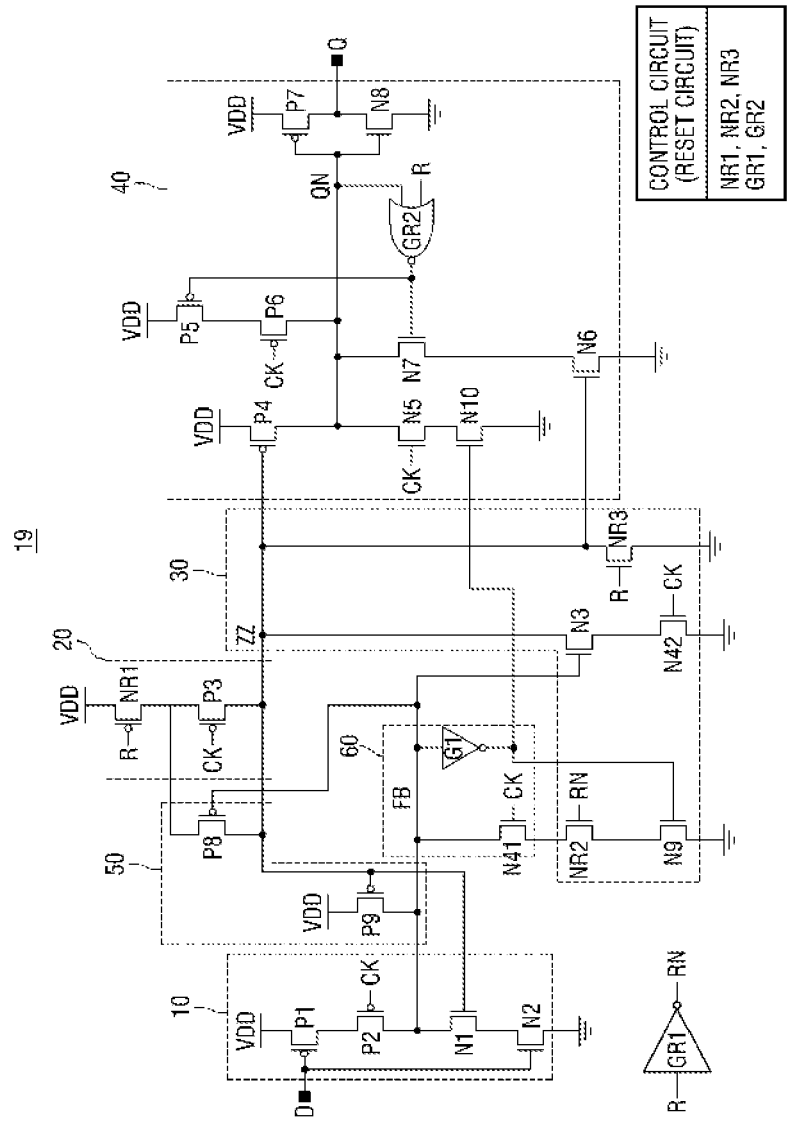
FIG. 21 is a circuit view of a semiconductor circuit according to a nineteenth exemplary embodiment.

FIG. 21 is a circuit view of a semiconductor circuit according to a 19th embodiment. The following description will focus on differences between the present embodiment and the previous embodiments.

Referring to FIG. 21, the semiconductor circuit 19 according to the 19th embodiment is different from the semiconductor circuit 17 shown in FIG. 19 in view of a connection order of a transistor N9 and a transistor N41. In other words, unlike in the aforementioned semiconductor circuit 17 shown in FIG. 19, in which a source of the transistor N9 is connected to a transistor NR2 and a drain of the transistor N41 is connected to the transistor NR2, a drain of the transistor N9 and a source of the transistor N41 are connected in the semiconductor circuit 19 according to the present embodiment.

Figure 22:
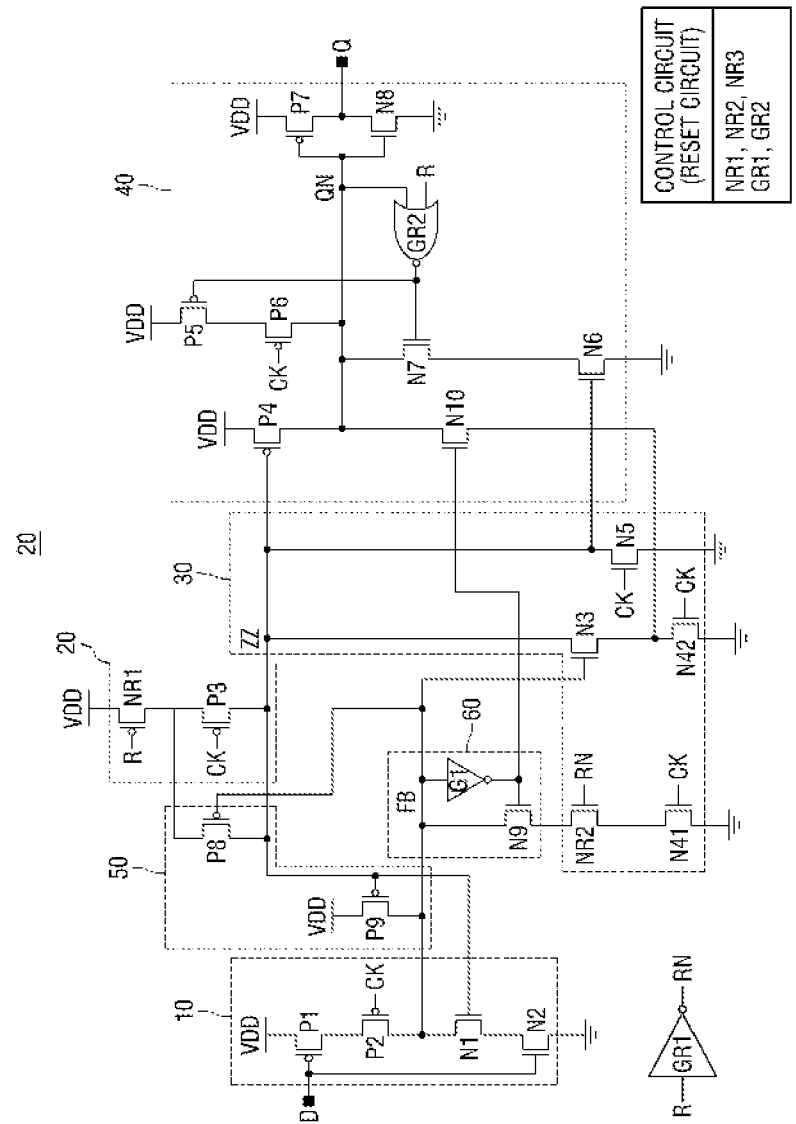
FIG. 22 is a circuit view of a semiconductor circuit according to a twentieth exemplary embodiment.

FIG. 22 is a circuit view of a semiconductor circuit according to a 20th embodiment. The following description will focus on differences between the present embodiment and the previous embodiments.

Referring to FIG. 22, the semiconductor circuit 20 according to the 20th embodiment is modified from the aforementioned semiconductor circuit 17 shown in FIG. 19 such that a transistor N5 and a transistor N42 are combined. That is to say, the transistor N5 of the semiconductor circuit 20 may perform functions of the transistor N5 and the transistor N42 of the semiconductor circuit 17. If a semiconductor circuit is constructed in such a manner, a semiconductor device manufactured using the same may have a reduced size.

Figure 23:
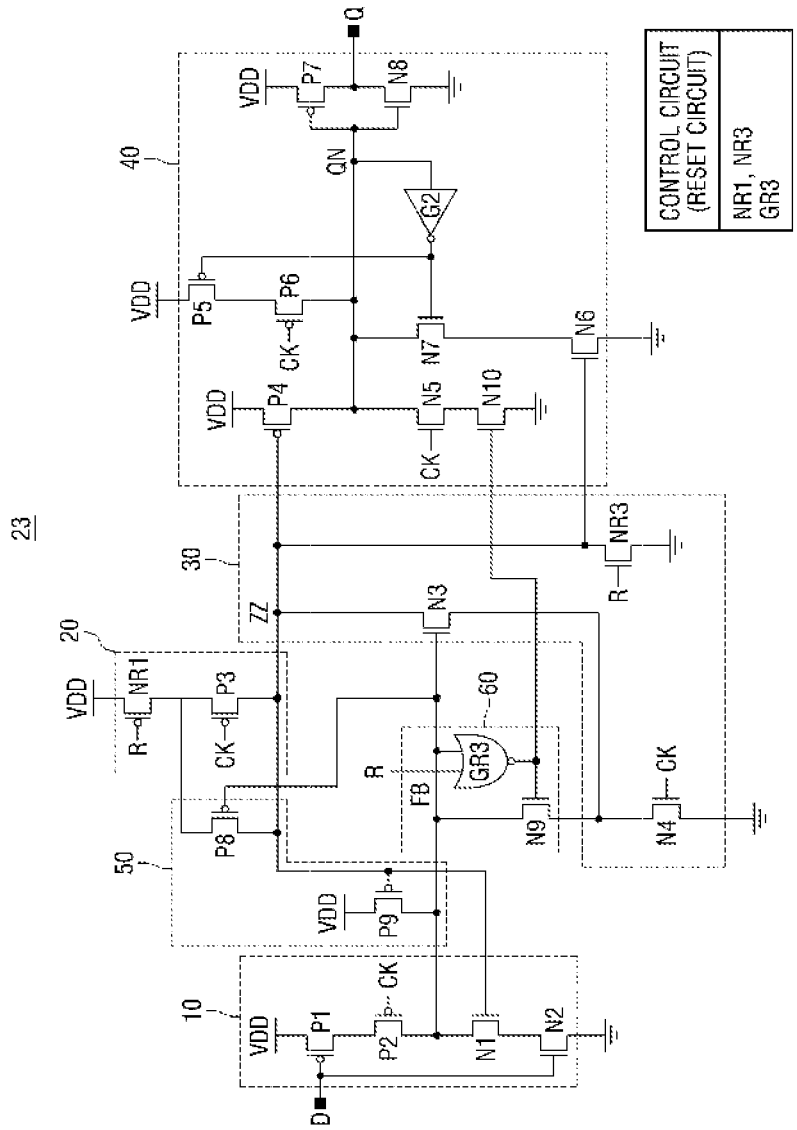
FIG. 23 is a circuit view of a semiconductor circuit according to a twenty-first exemplary embodiment.

FIG. 23 is a circuit view of a semiconductor circuit according to a 21st embodiment. In the following description will focus on differences between the present embodiment and the previous embodiments.

Referring to FIG. 23, the semiconductor circuit 23 according to the 21st embodiment may be different from the semiconductor circuit 5 shown in FIG. 7 in view of a configuration of a latch 40.

In detail, unlike in the aforementioned semiconductor circuit 5, a transistor N6 included in the latch 40 of the semiconductor circuit 23 may be connected to a transistor N7 but may not be connected to a transistor N10. In other words, a drain of the transistor N6 may be connected to a source of the transistor N7 but may not be connected to a source of the transistor N10.

Figure 24:
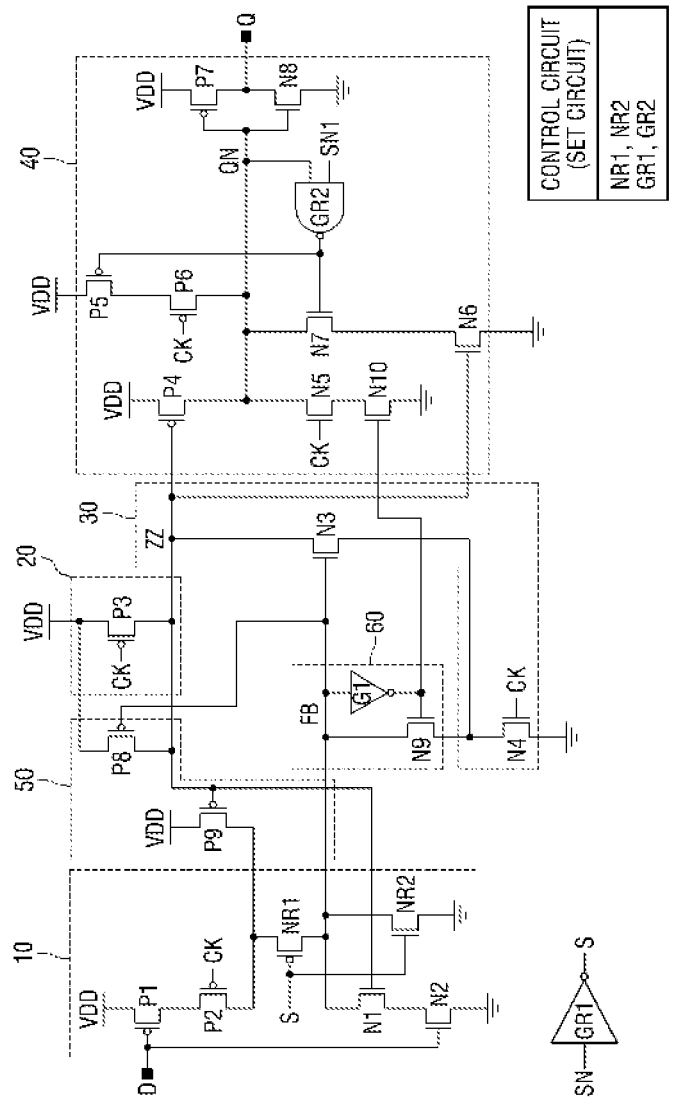
FIG. 24 is a circuit view of a semiconductor circuit according to a twenty-second exemplary embodiment.

FIG. 24 is a circuit view of a semiconductor circuit according to a 22nd embodiment. The following description will focus on differences between the present embodiment and the previous embodiments.

Referring to FIG. 24, the semiconductor circuit 24 according to the 22nd embodiment may be different from the semiconductor circuit 6 shown in FIG. 8 in view of a configuration of a latch 40.

In detail, unlike in the aforementioned semiconductor circuit 6, a transistor N6 included in the latch 40 of the semiconductor circuit 24 may be connected to a transistor N7 but may not be connected to a transistor N10. In other words, a drain of the transistor N6 may be connected to a source of the transistor N7 but may not be connected to a source of the transistor N10.

Figure 25:
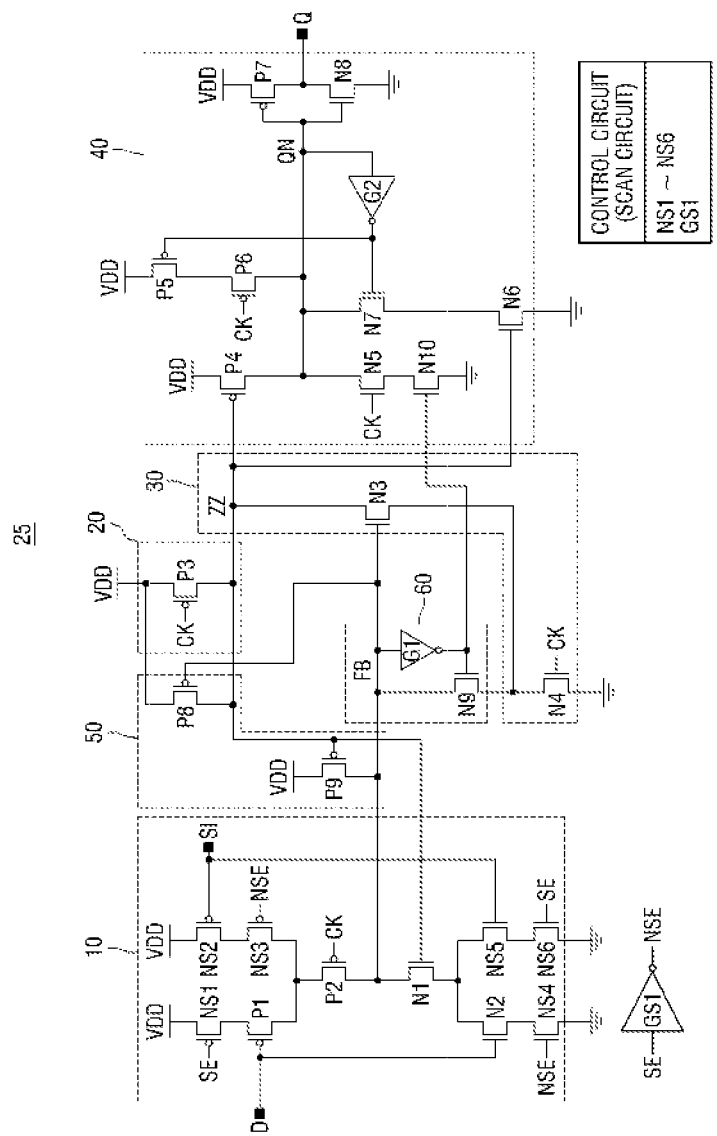
FIG. 25 is a circuit view of a semiconductor circuit according to a twenty-third exemplary embodiment.

FIG. 25 is a circuit view of a semiconductor circuit according to a 23rd embodiment. The following description will focus on differences between the present embodiment and the previous embodiments.

Referring to FIG. 25, the semiconductor circuit 25 according to the 23rd embodiment may be different from the semiconductor circuit 11 shown in FIG. 13 in view of a configuration of a latch 40.

In detail, unlike in the aforementioned semiconductor circuit 11, a transistor N6 included in the latch 40 of the semiconductor circuit 25 may be connected to a transistor N7 but may not be connected to a transistor N10. In other words, a drain of the transistor N6 may be connected to a source of the transistor N7 but may not be connected to a source of the transistor N10.

Figure 26:
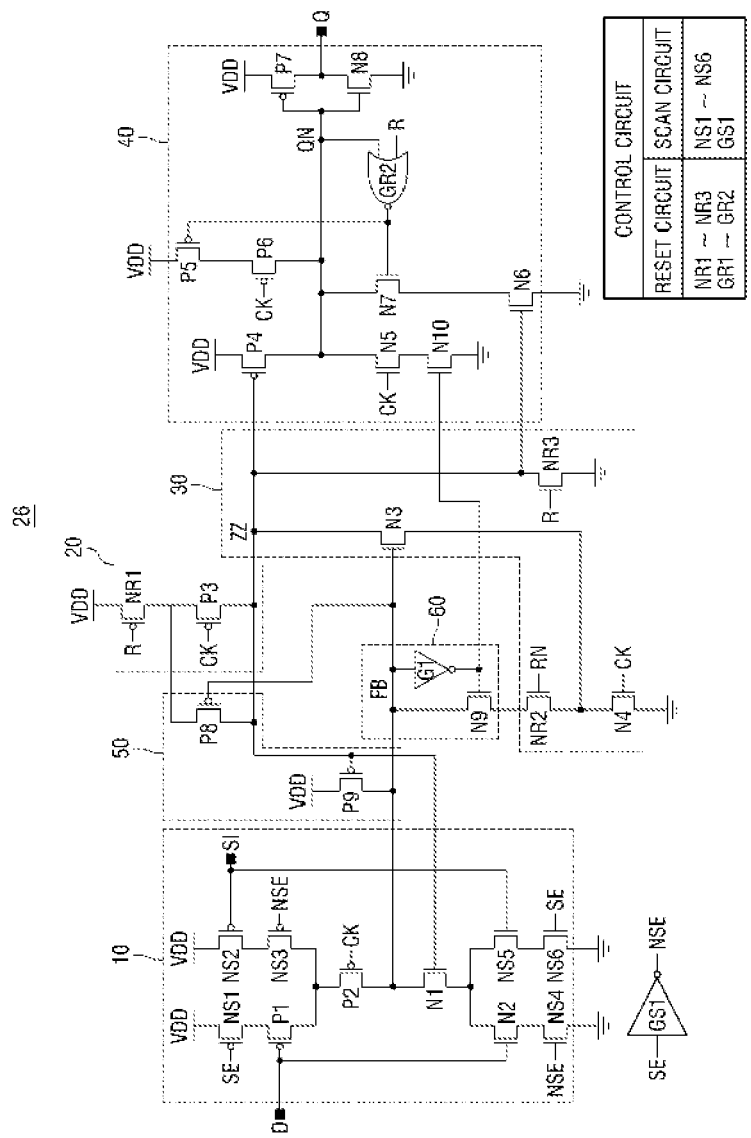
FIG. 26 is a circuit view of a semiconductor circuit according to a twenty-fourth exemplary embodiment.

FIG. 26 is a circuit view of a semiconductor circuit according to a 24th embodiment. The following description will focus on differences between the present embodiment and the previous embodiments.

Referring to FIG. 26, the semiconductor circuit 26 according to the 24th embodiment may be different from the semiconductor circuit 12 shown in FIG. 14 in view of a configuration of a latch 40.

In detail, unlike in the aforementioned semiconductor circuit 12, a transistor N6 included in the latch 40 of the semiconductor circuit 26 may be connected to a transistor N7 but may not be connected to a transistor N10. In other words, a drain of the transistor N6 may be connected to a source of the transistor N7 but may not be connected to a source of the transistor N10.

Figure 27:
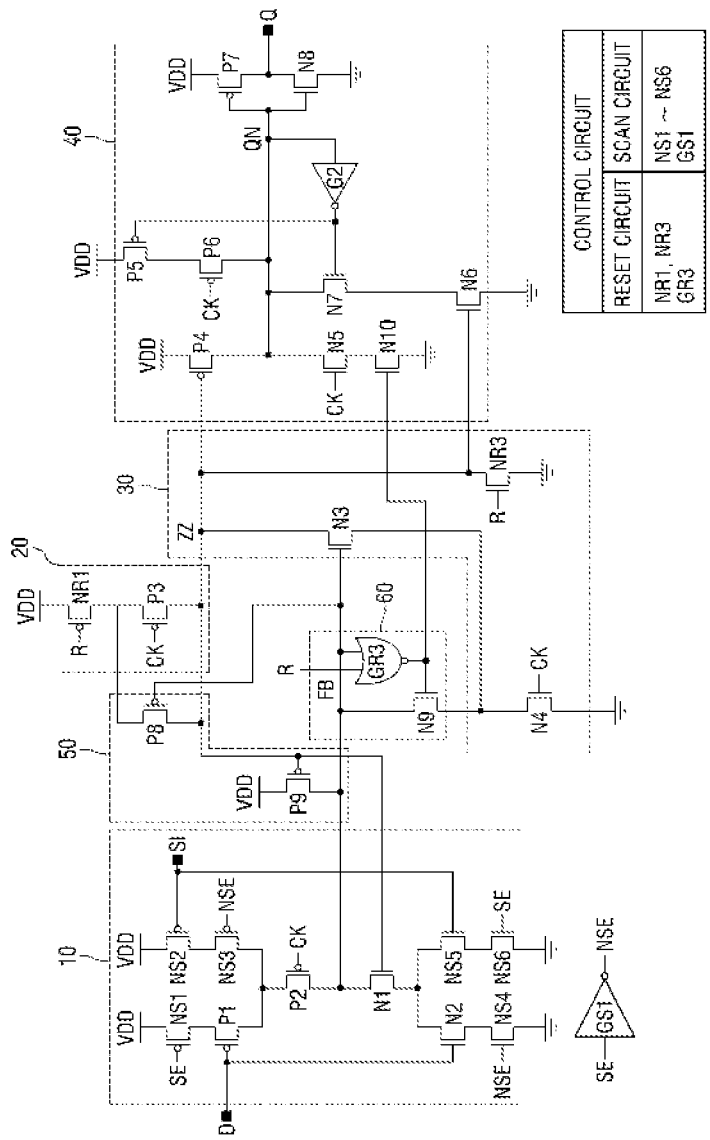
FIG. 27 is a circuit view of a semiconductor circuit according to a twenty-fifth exemplary embodiment.

FIG. 27 is a circuit view of a semiconductor circuit according to a 25th embodiment. The following description will focus on differences between the present embodiment and the previous embodiments.

Referring to FIG. 27, the semiconductor circuit 27 according to the 25th embodiment may be different from the semiconductor circuit 13 shown in FIG. 15 in view of a configuration of a latch 40.

In detail, unlike in the aforementioned semiconductor circuit 12, a transistor N6 included in the latch 40 of the semiconductor circuit 27 may be connected to a transistor N7 but may not be connected to a transistor N10. In other words, a drain of the transistor N6 may be connected to a source of the transistor N7 but may not be connected to a source of the transistor N10.

Figure 28:
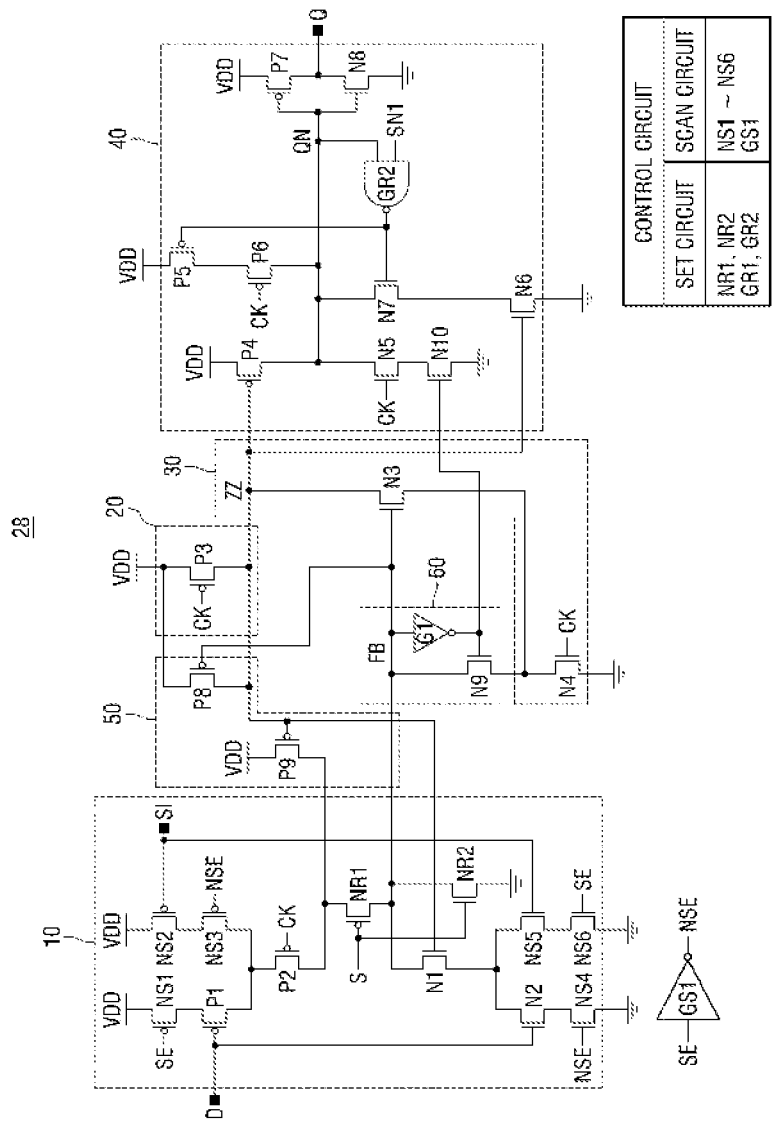
FIG. 28 is a circuit view of a semiconductor circuit according to a twenty-sixth exemplary embodiment.

FIG. 28 is a circuit view of a semiconductor circuit according to a 26th embodiment. The following description will focus on differences between the present embodiment and the previous embodiments.

Referring to FIG. 28, the semiconductor circuit 28 according to the 26th embodiment may be different from the semiconductor circuit 14 shown in FIG. 16 in view of a configuration of a latch 40.

In detail, unlike in the aforementioned semiconductor circuit 12, a transistor N6 included in the latch 40 of the semiconductor circuit 28 may be connected to a transistor N7 but may not be connected to a transistor N10. In other words, a drain of the transistor N6 may be connected to a source of the transistor N7 but may not be connected to a source of the transistor N10.

Figure 29A:
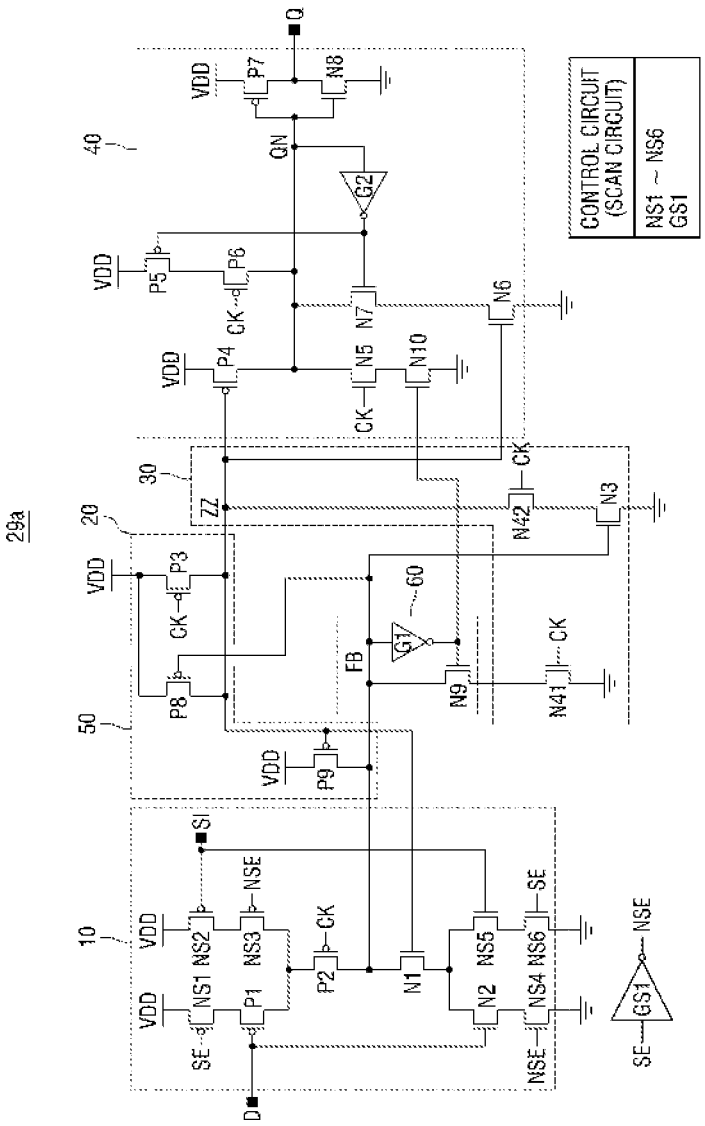
FIG. 29A is a circuit view of a semiconductor circuit according to a twenty-seventh exemplary embodiment.

FIG. 29A is a circuit view of a semiconductor circuit according to a 27th embodiment. The following description will focus on differences between the present embodiment and the previous embodiments.

Referring to FIG. 29A, the semiconductor circuit 29a according to the 27th embodiment is modified from the aforementioned semiconductor circuit 25 shown in FIG. 25 such that it has the same configuration as the semiconductor circuit 18 shown in FIG. 20.

In detail, as shown in FIG. 29A, a transistor N4 included in a third circuit 30 of the semiconductor circuit (semiconductor circuit 25 of FIG. 25) may be implemented to be separated into a transistor N41 and a transistor N42, and a connection order of a transistor N3 and the transistor N42 may be changed.

In such a manner, if a transistor (transistor N4 of FIG. 25) gated to a voltage level of a clock signal CK is implemented to be separated into the transistor N41 and the transistor N42 and the connection order of the transistor N3 and the transistor N42 is changed. Thus, coupling noise affecting a feedback node FB due to gate-source capacitance of the transistor N3 can be advantageously reduced.

The transistor N41, which is gated to a voltage level of a clock signal CK, may pull down a feedback node FB to a ground voltage, the transistor N3, which is gated to a voltage level of the feedback node FB, may pull down a latch input node ZZ to the ground voltage, and the third transistor N42, which is gated to the voltage level of the clock signal CK, may connect the transistor N3 to the latch input node ZZ.

A latch 40 of the semiconductor circuit 29a may include a transistor P4 gated to a voltage level of the latch input node ZZ and pulling up an inverted output node QN to a power voltage VDD, a transistor N10 gated to an inverted voltage level of the feedback node FB and pulling down the inverted output node QN to a second voltage, a transistor N5 gated to the voltage level of the clock signal CK and connecting the transistor N10 to the inverted output node QN, a transistor N6 gated to the voltage level of the latch input node ZZ and pulling down the inverted output node QN to the ground voltage, a transistor N7 gated to an inverted voltage level of the inverted output node QN and connecting the transistor N6 to the inverted output node QN, a transistor P5 gated to the inverted voltage level of the inverted output node QN and pulling up the inverted output node QN to the power voltage VDD, and a transistor P6 gated to the voltage level of the clock signal CK and connecting the transistor P5 to the inverted output node QN.

Here, the transistors P4 to P6, N5 to N7, and N10 may be used to invert the voltage level of the latch input node ZZ based on the voltage level of the clock signal CK and the voltage level of the feedback node FB to transmit the inverted voltage level to the inverted output node QN.

In some exemplary embodiments, the transistors N5 to N7 and N10 may include, for example, NMOS transistors and the transistors P4 to P6 may include, for example, PMOS transistors, but aspects of the exemplary embodiments are not limited thereto.

Figure 29B:
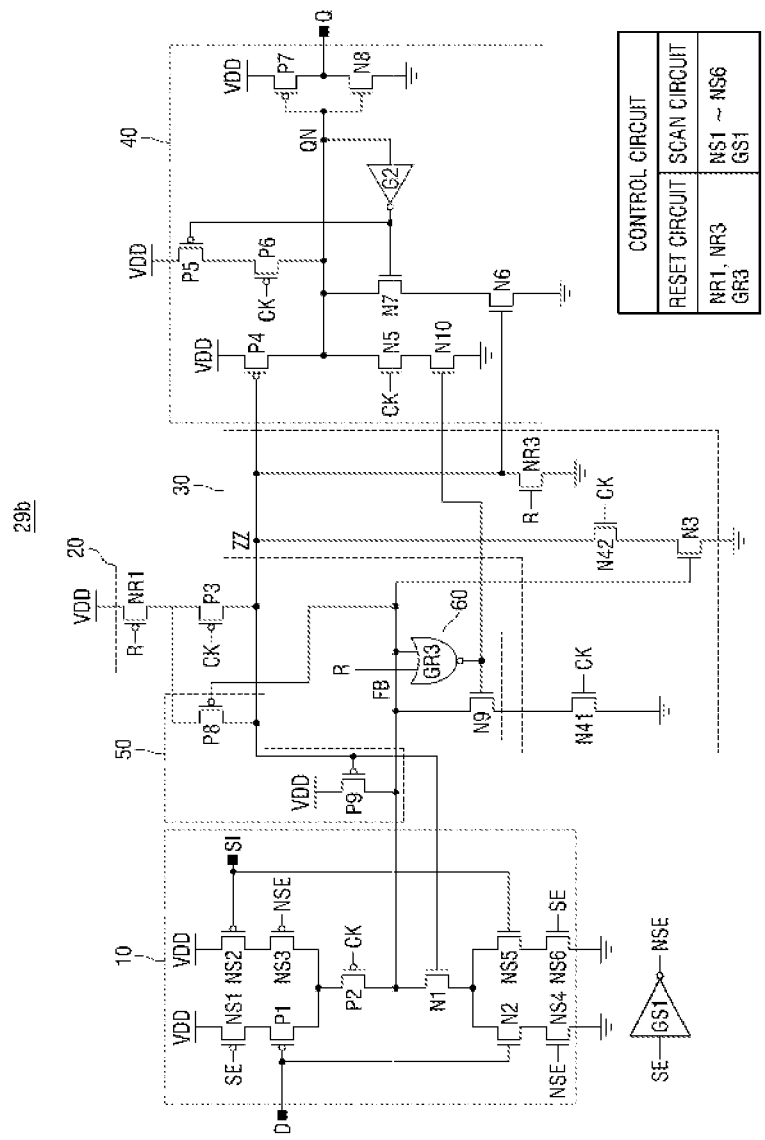

FIG. 29B is a circuit view of a semiconductor circuit according to a 28th embodiment. The following description will focus on differences between the present embodiment and the previous embodiments.

Referring to FIG. 29B, the semiconductor circuit 29b according to the 28th embodiment is modified from the aforementioned semiconductor circuit 27 shown in FIG. 27 such that it has the same configuration as the semiconductor circuit 18 shown in FIG. 20.

In detail, as shown in FIG. 29B, a transistor N4 included in a third circuit 30 of the semiconductor circuit (semiconductor circuit 27 of FIG. 27) may be implemented to be separated into a transistor N41 and a transistor N42, and a connection order of a transistor N3 and the transistor N42 may be changed.

In such a manner, if a transistor (transistor N4 of FIG. 27) gated to a voltage level of a clock signal CK is implemented to be separated into the transistor N41 and the transistor N42 and the connection order of the transistor N3 and the transistor N42 is changed. Thus, coupling noise affecting a feedback node FB due to gate-source capacitance of the transistor N3 can be advantageously reduced.

Figure 30A:
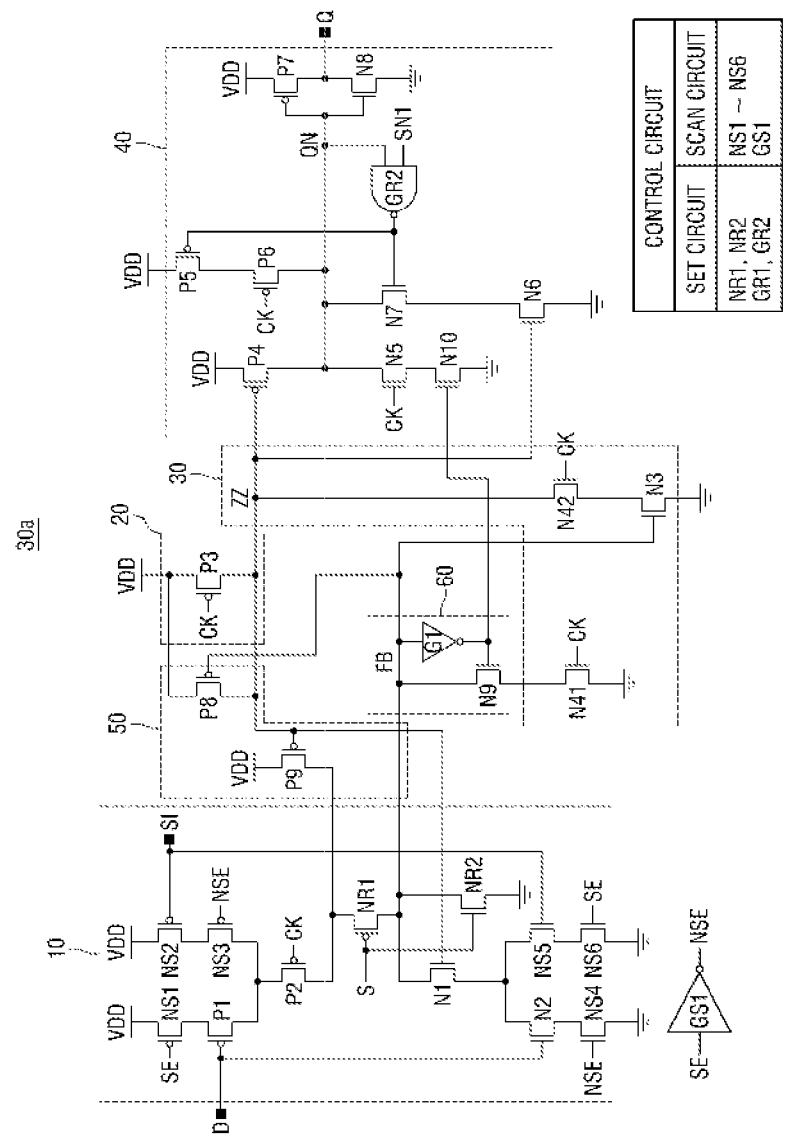
FIG. 30A is a circuit view of a semiconductor circuit according to a twenty-ninth exemplary embodiment.

FIG. 30A is a circuit view of a semiconductor circuit according to a 29th embodiment. The following description will focus on differences between the present embodiment and the previous embodiments.

Referring to FIG. 30A, the semiconductor circuit 30a according to the 29th embodiment is modified from the aforementioned semiconductor circuit 28 shown in FIG. 28 such that it has the same configuration as the semiconductor circuit 18 shown in FIG. 20.

In detail, as shown in FIG. 30A, a transistor N4 included in a third circuit 30 of the semiconductor circuit (semiconductor circuit 28 of FIG. 28) may be implemented to be separated into a transistor N41 and a transistor N42, and a connection order of a transistor N3 and the transistor N42 may be changed.

In such a manner, if a transistor (transistor N4 of FIG. 28) gated to a voltage level of a clock signal CK is implemented to be separated into the transistor N41 and the transistor N42 and the connection order of the transistor N3 and the transistor N42 is changed, coupling noise affecting a feedback node FB due to gate-source capacitance of the transistor N3 can be advantageously reduced.

Figure 30B:
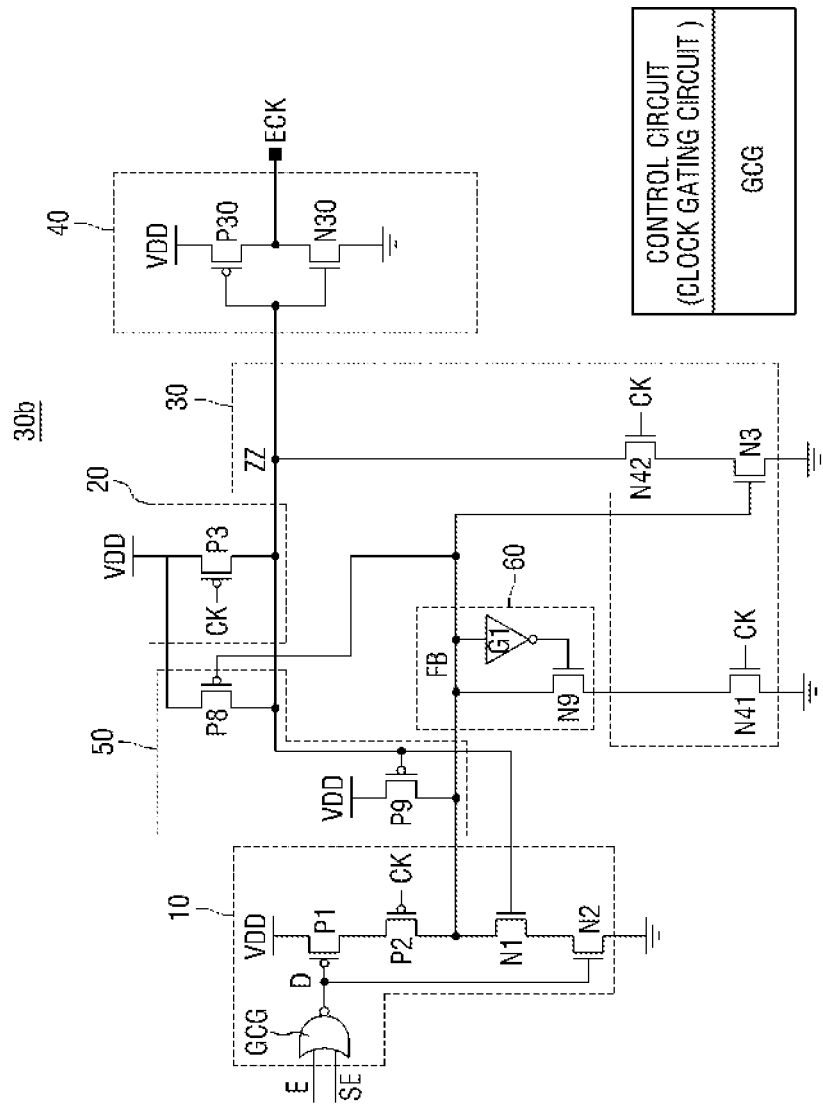
FIG. 30B is a circuit view of a semiconductor circuit according to a thirtieth exemplary embodiment.

FIG. 30B is a circuit view of a semiconductor circuit according to a 30th embodiment. The following description will focus on differences between the present embodiment and the previous embodiments.

Referring to FIG. 30B, the semiconductor circuit 30b according to the 30th embodiment is modified such that the aforementioned semiconductor circuit 1 shown in FIG. 2 is replaced by a clock gating circuit.

In detail, in the semiconductor circuit 30b, a first circuit 10 may further include an NOR gate GCG receiving an enable signal E as a first input and a scan enable signal SE as a second input.

In addition, in the semiconductor circuit 30b, a third circuit 30 may be modified, like in the semiconductor circuit 18 shown in FIG. 20.

In detail, as shown in FIG. 30B, a transistor N4 included in the third circuit 30 of the semiconductor circuit (semiconductor circuit 1 of FIG. 2) may be implemented to be separated into a transistor N41 and a transistor N42, and a connection order of a transistor N3 and the transistor N42 may be changed.

Meanwhile, as shown in FIG. 30B, a latch 40 of the semiconductor circuit (semiconductor circuit 1 of FIG. 2) may be modified to have a configuration of an inverter including a transistor P30 and a transistor N30.

If an enable signal E of first level H as a control signal is applied to the semiconductor circuit 30b, the semiconductor circuit 30b may perform a clock gating operation. In other words, a clock signal synchronized with the clock signal CK may be output to an output node ECK of the semiconductor circuit 30b.

Meanwhile, if an enable signal E of second level L as a control signal is applied to the semiconductor circuit 30b, the semiconductor circuit 30b may perform a clock gating operation according to the voltage level of a scan enable signal SE. In other words, if the scan enable signal SE of first level H is applied to the semiconductor circuit 30b, a clock signal synchronized with the clock signal CK may be output to the output node ECK.

Figure 31:
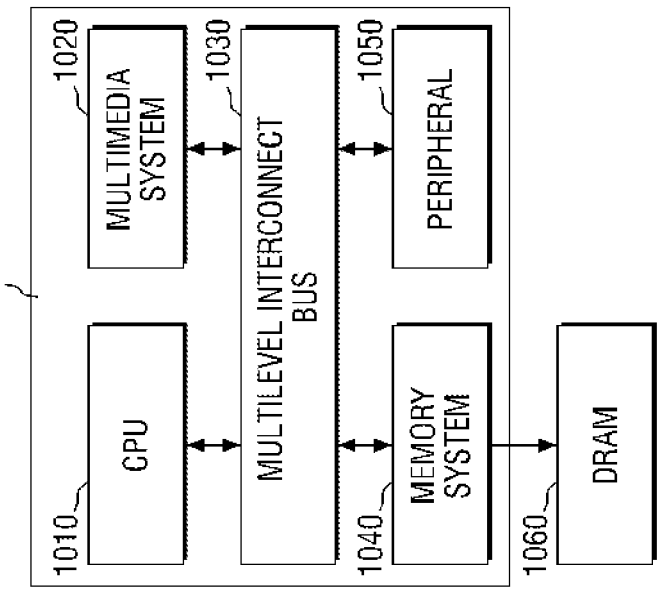
FIG. 31 is a block diagram of an SoC system including semiconductor circuits according to exemplary embodiments.

FIG. 31 is a block diagram of a SoC system including semiconductor circuits according to exemplary embodiments.

Referring to FIG. 31, the SoC system 1000 includes an application processor 1001 and a DRAM 1060.

The application processor 1001 may include a central processing unit (CPU) 1010, a multimedia system 1020, a bus 1030, a memory system 1040, and a peripheral circuit 1050.

The central processing unit 1010 may perform an operation required to drive the SoC system 1000. In some exemplary embodiments, the central processing unit 1010 may be configured in a multi-core environment including a plurality of cores.

The multimedia system 1020 may be used in performing a variety of multimedia functions in the SoC system 1000. The multimedia system 1020 may include a 3D engine module, a video codec, a display system, a camera system, and a post-processor.

The bus 1030 may be used in performing data communication among the central processing unit 1010, the multimedia system 1020, the memory system 1040, and the peripheral circuit 1050. In some exemplary embodiments, the bus 1030 may have a multi-layered structure. In detail, examples of the bus 1030 may include a multi-layer advanced high-performance bus (AHB), or a multi-layer advanced eXtensible interface (AXI), but aspects of the exemplary embodiments are not limited thereto.

The memory system 1040 may provide environments necessary for high-speed operation by connecting the AP 1001 to an external memory (for example, the DRAM 1060). In some exemplary embodiments, the memory system 1040 may include a separate controller (for example, a DRAM controller) for controlling the external memory (for example, the DRAM 1060).

The peripheral circuit 1050 may provide environments necessary for smoothly connecting the SoC system 1000 to an external device (for example, a main board). Accordingly, the peripheral circuit 1050 may include various kinds of interfaces which enable the external device to be compatible with the SoC system 1000 when connected to the SoC system 1000.

The DRAM 1060 may function as a working memory required to operate the AP 1001. In some exemplary embodiments, as shown, the DRAM 1060 may be disposed outside the AP 1001. In detail, the DRAM 1060 may be packaged with the AP 1001 in the form of a package on package (PoP).

At least one of components of the SoC system 1000 may employ one of the aforementioned semiconductor circuits 1 to 30b according to exemplary embodiments.

Figure 32:
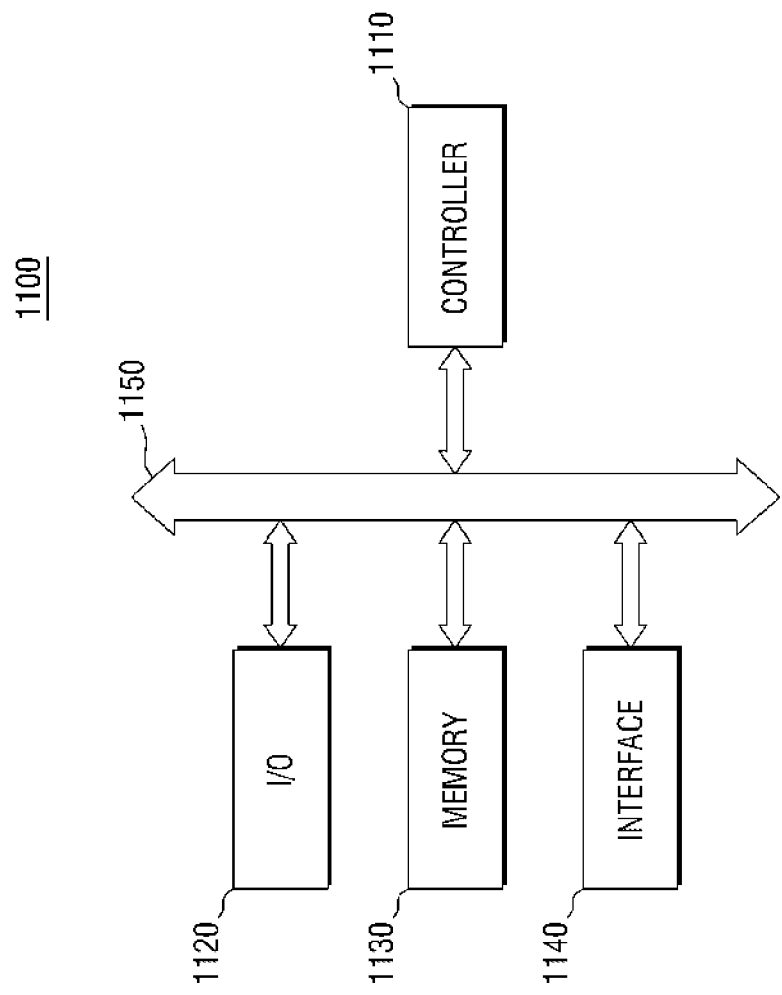
FIG. 32 is a block diagram of an electronic system including semiconductor circuits according to exemplary embodiments.

FIG. 32 is a block diagram of an electronic system including semiconductor circuits according to exemplary embodiments.

Referring to FIG. 32, the electronic system 1100 according to the exemplary embodiments may include a controller 1110, an input/output device (I/O) 1120, a memory device 1130, an interface 1140, and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a keypad, a keyboard, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on.

Although not shown, the electronic system 1100 may further include high-speed DRAM and/or SRAM as a working memory for improving the operation of the controller 1110.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

At least one of components of the electronic system 1100 may employ one of the semiconductor circuits 1 to 30b according to the exemplary embodiments.

Figure 33:
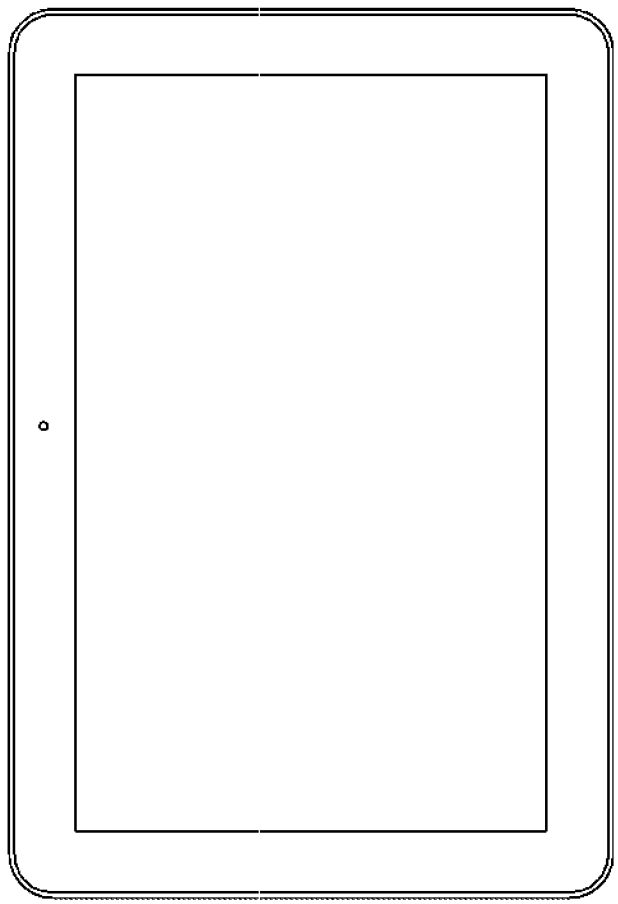
FIGS. 33 to 35 illustrate exemplary semiconductor systems to which semiconductor circuits according to some exemplary embodiments can be applied.
Figure 34:
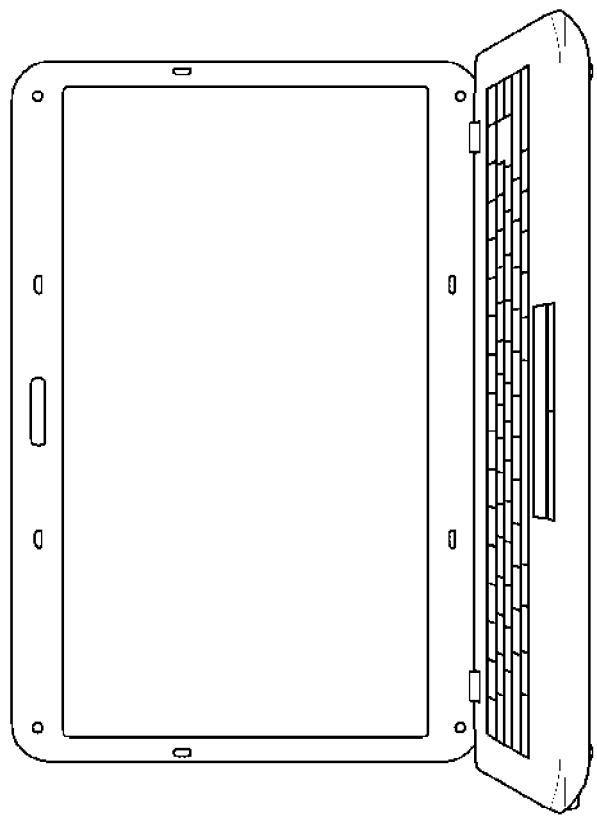
Figure 35:

FIGS. 33 to 35 illustrate exemplary semiconductor systems to which semiconductor circuits according to some exemplary embodiments can be applied. FIG. 33 illustrates an application example in which the semiconductor system according to an exemplary embodiment is applied to a tablet PC 1200, FIG. 34 illustrates an application example in which the semiconductor system according to an exemplary embodiment is applied to a notebook computer 1300, and FIG. 35 illustrates an application example in which the semiconductor system according to an exemplary embodiment is applied to a smart phone 1400. At least one of the semiconductor circuits 1 to 30b according to some exemplary embodiments may be applied to the tablet PC 1200, the notebook computer 1300, and the smart phone 1400.

In addition, it is obvious to one skilled in the art that the semiconductor devices may be applied according to the exemplary embodiments. That is to say, in the illustrated embodiments, the tablet PC 1200, the notebook computer 1300, and the smart phone 1400 are illustrated as exemplary semiconductor systems, but aspects of the exemplary embodiments are not limited thereto. In some exemplary embodiments, the semiconductor system may be implemented by a computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a potable game console, a navigation device, a black box, a digital camera, a 3-dimensional (3D) television, a digital audio recorder, a digital audio player, a digital picture recorder, a digital picture player, digital video recorder, a digital video player, and so on.

While the exemplary embodiments has been particularly shown and described with reference to exemplary embodiments thereof, it will be understood by those of ordinary skill in the art that various changes in form and details may be made therein without departing from the spirit and scope of the exemplary embodiments as defined by the following claims. It is therefore desired that the present embodiments be considered in all respects as illustrative and not restrictive, reference being made to the appended claims rather than the foregoing description to indicate the scope of the exemplary embodiments.

What is claimed is:

1. A semiconductor circuit comprising:
a pre-charge circuit configured to pre-charge a latch input node based on a voltage level of a clock signal;
a latch configured to output an output data based on the voltage level of the clock signal, and a voltage level of the latch input node and a voltage level of an intermediate node; and
a feedback transistor gated to a voltage level of a feedback node,
wherein the latch comprises:
a first transistor gated to the voltage level of the latch input node and configured to pull up an inverted output node;
a second transistor gated to the voltage level of the intermediate node, and a third transistor gated to the voltage level of the clock signal, to pull down the inverted output node; and
a fourth transistor gated to the voltage level of the latch input node, and a fifth transistor gated to an inverted voltage level of the inverted output node, to keep the inverted output node,
wherein the second transistor and the third transistor are connected in series between the inverted output node and a ground voltage, and the fourth transistor and the fifth transistor are connected in series between the inverted output node and the ground voltage,
wherein the feedback node provides a signal to a single stage of a logic gate, and the logic gate drives the intermediate node.

2. The semiconductor circuit of claim 1, further comprising:
a sixth transistor gated to the voltage level of the feedback node and configured to keep the latch input node up.

3. The semiconductor circuit of claim 1, further comprising:
a seventh transistor gated to the voltage level of the latch input node and configured to keep a feedback node up.

4. The semiconductor circuit of claim 1, wherein the latch further comprises a NOR gate receiving the voltage level of the inverted output node as a first input, and a voltage level of a reset signal as a second input, and outputting a result of an NOR operation on the first input and the second input, and
the fifth transistor is gated to the result of the NOR operation.

5. The semiconductor circuit of claim 4, wherein the second pre charge circuit further comprises an eighth transistor gated to the voltage level of the reset signal.

6. The semiconductor circuit of claim 1, wherein the latch further comprises an inverter receiving the voltage level of the inverted output node as an input, and outputting the inverted voltage level of the inverted output node.

7. The semiconductor circuit of claim 6, wherein the pre-charge circuit further comprises an eighth transistor gated to a voltage level of a reset signal.

8. The semiconductor circuit of claim 1, wherein the latch further comprises a NAND gate receiving the voltage level of the inverted output node as a first input, and a voltage level of an inverted set signal as a second input, and outputting a result of an NAND operation on the first input and the second input, and
the fifth transistor is gated to the result of the NAND operation.

9. The semiconductor circuit of claim 1, wherein the latch further comprises
- a ninth transistor gated to the inverted voltage level of the inverted output node, and a tenth transistor gated to the voltage level of the clock signal, to provide a power voltage to the inverted output node,
- wherein the ninth transistor and the tenth transistor are connected in series between the power voltage and the inverted output node.

10. The semiconductor circuit of claim 1, wherein the latch further comprises
- an eleventh transistor gated to the inverted output node and configured to output a power voltage as the output data, and
- a twelfth transistor gated to the inverted output node and configured to output a ground voltage as the output data.

* * * * *